US012575401B2

(12) United States Patent
Suthram et al.

(10) Patent No.: US 12,575,401 B2
(45) Date of Patent: Mar. 10, 2026

(54) INTEGRATED CIRCUIT DEVICES WITH ANGLED TRANSISTORS AND ANGLED ROUTING TRACKS

(71) Applicant: Intel Corporation, Santa Clara, CA (US)

(72) Inventors: Sagar Suthram, Portland, OR (US); Elliot Tan, Portland, OR (US); Abhishek A. Sharma, Portland, OR (US); Shem Odhiambo Ogadhoh, West Linn, OR (US); Wilfred Gomes, Portland, OR (US); Pushkar Sharad Ranade, San Jose, CA (US); Anand S. Murthy, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 301 days.

(21) Appl. No.: 18/314,875

(22) Filed: May 10, 2023

(65) Prior Publication Data

US 2023/0420363 A1 Dec. 28, 2023

Related U.S. Application Data

(63) Continuation of application No. PCT/US2022/034561, filed on Jun. 22, 2022.

(51) Int. Cl.
H01L 23/528 (2006.01)
H10D 84/85 (2025.01)
(52) U.S. Cl.
CPC ......... H01L 23/528 (2013.01); H10D 84/853 (2025.01)

(58) Field of Classification Search
CPC . H01L 23/528; H01L 23/5286; H10D 84/853; H10D 30/62
See application file for complete search history.

(56) References Cited

U.S. PATENT DOCUMENTS

| | | | |
|---|---|---|---|
| 5,218,568 A | 6/1993 | Lin et al. | |
| 5,412,596 A | 5/1995 | Hoshiba | |
| | (Continued) | | |

FOREIGN PATENT DOCUMENTS

| | | |
|---|---|---|
| JP | 2004146626 A | 5/2004 |
| WO | 2018111215 A1 | 6/2018 |
| | (Continued) | |

OTHER PUBLICATIONS

U.S. Appl. No. 17/829,706, filed Jun.1, 2022, Sagar Suthram.
U.S. Appl. No. 18/312,847, filed May 5, 2023, Abhishek A. Sharma.

*Primary Examiner* — Patricia D Valenzuela
(74) *Attorney, Agent, or Firm* — Akona IPI PC

(57) ABSTRACT
IC devices with angled transistors and angled routing tracks, and related assemblies and methods, are disclosed herein. A transistor is referred to as an "angled transistor" if a longitudinal axis of an elongated semiconductor structure of the transistor (e.g., a fin or a nanoribbon) is neither perpendicular nor parallel to any edges of front or back sides of a support structure (e.g., a die) over which the transistor is implemented. Similarly, a routing track is referred to as an "angled routing track" if the routing track is neither perpendicular nor parallel to any edges of front or back faces of the support structure. Angled transistors and angled routing tracks provide a promising way to increasing densities of transistors on the limited real estate of semiconductor chips and/or decreasing adverse effects associated with continuous scaling of IC components.

20 Claims, 18 Drawing Sheets

(56)                    References Cited

U.S. PATENT DOCUMENTS

| | | | |
|---|---|---|---|
| 5,515,311 | A | 5/1996 | Mihara |
| 5,600,587 | A | 2/1997 | Koike |
| 9,773,728 | B1 | 9/2017 | Juengling |
| 2003/0102518 | A1 | 6/2003 | Fried et al. |
| 2004/0051143 | A1 | 3/2004 | Oh et al. |
| 2005/0199913 | A1* | 9/2005 | Hofmann ............... H10B 69/00 |
| | | | 438/257 |
| 2006/0268597 | A1 | 11/2006 | Sakuma |
| 2008/0037311 | A1 | 2/2008 | Tanaka |
| 2008/0048226 | A1 | 2/2008 | Heo et al. |
| 2008/0121956 | A1 | 5/2008 | Kanaya |
| 2009/0121291 | A1 | 5/2009 | Anderson et al. |
| 2010/0140710 | A1 | 6/2010 | Kuroda |
| 2010/0321975 | A1 | 12/2010 | Kimura et al. |
| 2012/0040528 | A1 | 2/2012 | Kim et al. |
| 2012/0314476 | A1 | 12/2012 | Appenzeller et al. |
| 2014/0008728 | A1 | 1/2014 | Kamo |
| 2016/0027490 | A1 | 1/2016 | Müller |
| 2016/0055290 | A1 | 2/2016 | Weng |
| 2018/0061846 | A1 | 3/2018 | Gan |
| 2018/0182763 | A1* | 6/2018 | Juengling ............ H10B 12/053 |
| 2019/0172832 | A1 | 6/2019 | Chang et al. |
| 2020/0091162 | A1 | 3/2020 | Morris et al. |
| 2021/0104550 | A1 | 4/2021 | Do |
| 2021/0367045 | A1 | 11/2021 | Laforet et al. |
| 2021/0375883 | A1 | 12/2021 | Hsu et al. |
| 2022/0059414 | A1 | 2/2022 | Yang et al. |
| 2024/0008255 | A1 | 1/2024 | Sharma et al. |
| 2025/0159953 | A1 | 5/2025 | Ghani et al. |

FOREIGN PATENT DOCUMENTS

| | | |
|---|---|---|
| WO | 2018125024 A1 | 7/2018 |
| WO | 2019132927 A1 | 7/2019 |

* cited by examiner

INTEGRATED CIRCUIT DEVICES WITH ANGLED TRANSISTORS AND ANGLED ROUTING TRACKS

CROSS REFERENCE TO RELATED APPLICATIONS

This application is a continuation of (and claims the benefit and priority under 35 U.S.C. 120 of) International Application No. PCT/US2022/034561, filed 22 Jun. 2022, entitled "INTEGRATED CIRCUIT DEVICES WITH ANGLED TRANSISTORS AND ANGLED ROUTING TRACKS," the disclosure of which is considered part of and is incorporated by reference in the disclosure of this application.

BACKGROUND

For the past several decades, the scaling of features in integrated circuits (ICs) has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for the ever-increasing capacity, however, is not without issue. The necessity to optimize the performance of each device and each contact becomes increasingly significant. Careful design of transistors may help with such an optimization.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
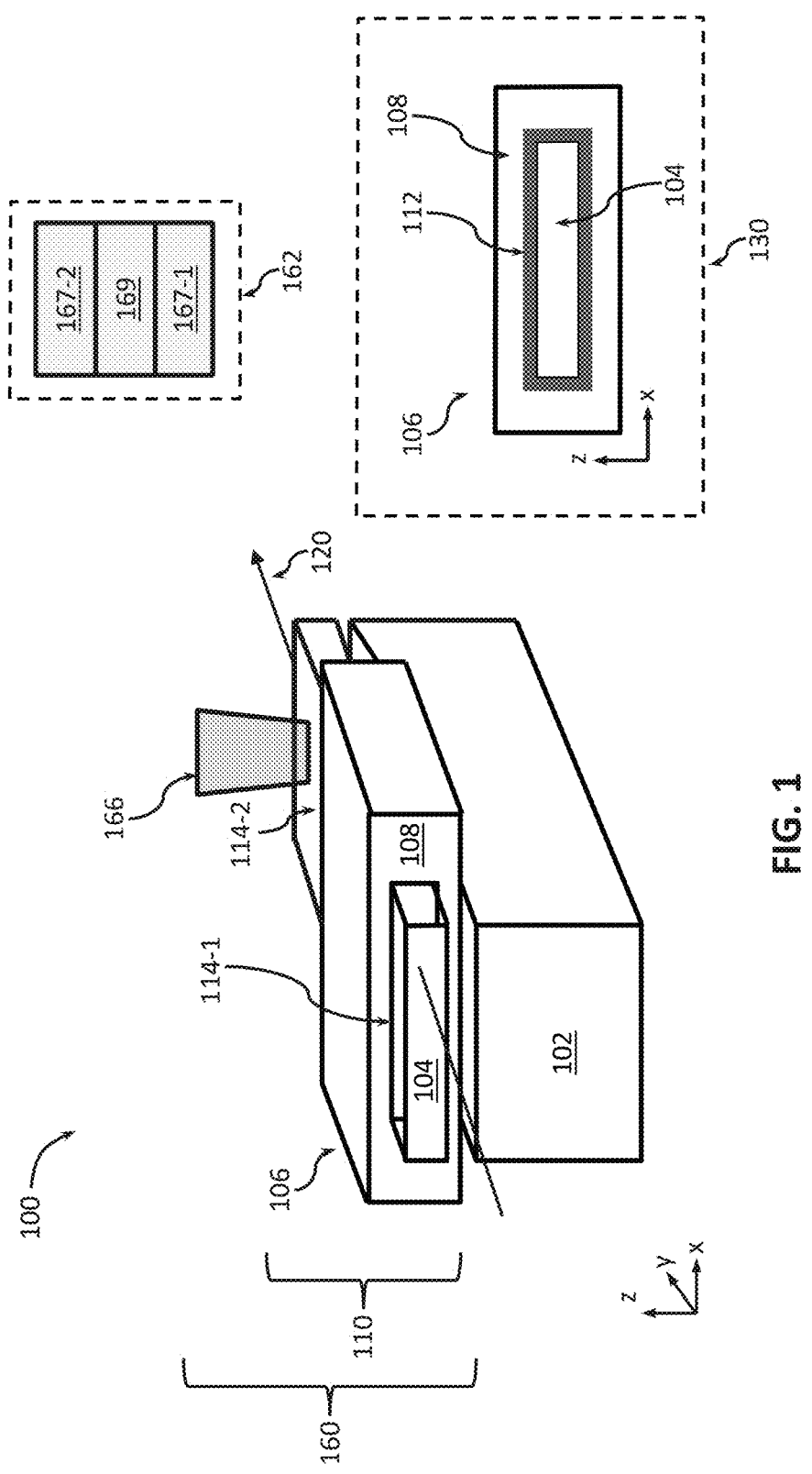
FIG. 1 provides a perspective view of an example IC device implementing a nanoribbon transistor, in accordance with some embodiments.

IC devices with angled transistors and angled routing tracks, and related assemblies and methods, are disclosed herein. The devices, assemblies, and methods of this disclosure each have several innovative aspects, no single one of which is solely responsible for all the desirable attributes disclosed herein. Details of one or more implementations of the subject matter described in this specification are set forth in the description below and the accompanying drawings.

For purposes of illustrating IC devices with angled transistors and angled routing tracks, proposed herein, it might be useful to first understand phenomena that may come into play in such arrangements. The following foundational information may be viewed as a basis from which the present disclosure may be properly explained. Such information is offered for purposes of explanation only and, accordingly, should not be construed in any way to limit the broad scope of the present disclosure and its potential applications.

A field-effect transistor (FET), e.g., a metal-oxide-semiconductor (MOS) FET (MOSFET), is a three-terminal device that includes source, drain, and gate terminals and uses electric field to control current flowing through the device. A FET typically includes a semiconductor channel material, a source region and a drain region provided in the channel material, and a gate stack that includes at least a gate electrode material and, optionally, may also include a gate insulator, where the gate stack is provided over a portion of the channel material between the source region and the drain region.

Recently, FETs with non-planar architectures, such as FinFETs (also sometimes referred to as "wrap around gate transistors" or "tri-gate transistors") and nanoribbon/nanowire transistors (also sometimes referred to as "gate all-around (GAA) transistors"), have been extensively explored as alternatives to transistors with planar architectures.

In a FinFET, an elongated semiconductor structure (e.g., an elongated structure that includes one or more semiconductor materials) shaped as a fin extends away from a base (e.g., from a semiconductor substrate or any suitable support structure). A portion of a fin that is closest to the base may be enclosed by an insulator material. Such an insulator material, typically an oxide, is commonly referred to as a "shallow trench isolation" (STI), and the portion of the fin enclosed by the STI is referred to as a "subfin portion" or simply a "subfin." A gate stack may wrap around an upper portion of the fin (e.g., the portion farthest away from the base). The portion of the fin around which the gate stack wraps is referred to as a "channel region" (or, alternatively, as a "channel portion" or simply a "channel") of a FinFET. A semiconductor material of the channel region is commonly referred to as a "channel material" of the transistor. FinFETs are sometimes referred to as "tri-gate transistors" because, in use, such transistors may form conducting channels on three "sides" of the channel region of the fin. A source region and a drain region may be provided in the fin on the opposite sides of the gate stack, forming, respectively, a source and a drain of a FinFET.

In a nanoribbon transistor, a gate stack may be provided around a portion of an elongated semiconductor structure called "nanoribbon", forming a gate on all sides of the nanoribbon. The "channel" or the "channel region" of a nanoribbon transistor is the portion of the nanoribbon around which the gate stack wraps. Such transistors are sometimes referred to as "GAA transistors" because, in use, such transistors may form conducting channels on all "sides" of the channel region of the nanoribbon. A source region and a drain region are provided in the nanoribbon on each side of the gate stack, forming, respectively, a source and a drain of a nanoribbon transistor. In some settings, the term "nanoribbon" has been used to describe an elongated semiconductor structure that has a substantially rectangular transverse cross-section (e.g., a cross-section in a plane perpendicular to the longitudinal axis of the structure), while the term "nanowire" has been used to describe a similar structure but with a substantially circular or square transverse cross-sections. In the following, a single term "nanoribbon transistor" is used to describe all non-planar transistors where a gate stack wraps around substantially all sides of an elongated semiconductor structure, independent of the shape of the transverse cross-section. Thus, as used herein, the term "nanoribbon transistor" is used to cover transistors with elongated semiconductor structures that have substantially rectangular transverse cross-sections (possibly with rounded corners), transistors with elongated semiconductor structures that have substantially square transverse cross-sections (possibly with rounded corners), transistors with elongated semiconductor structures that have substantially circular or elliptical/oval transverse cross-sections, as well as transistors with elongated semiconductor structures that have any polygonal transverse cross-sections.

One or more layers of an IC device in which transistors (e.g., FinFETs, nanoribbon transistors, and other types of transistors) and other active IC components are implemented may be referred to as a "transistor layer" (also referred to as "device layer"). On the other hand, one or more layers in which routing tracks for providing electrical connectivity (e.g., in terms of signals and power) for various terminals of the transistors and/or other devices of the transistor layer of the IC device may be referred to as a "metallization layer." For example, the transistor layer may be a front-end-of-line (FEOL) layer, while the metallization layer may be a back-end-of-line (BEOL) layer of an IC device, but, in general, the transistor layer and the metallization layer may be provided in any layers of an IC device as long as they are in different planes (e.g., at different distances from) a support structure (e.g., a die, a chip, a substrate, a carrier substrate, or a package substrate) of the IC device, or some other reference plane. Typically, an IC device includes a metallization stack, which is a collection of several metallization layers, stacked above one another, in which different routing tracks are provided, with electrically conductive vias (or, simply, "vias") providing electrical connectivity between the routing tracks of different layers. Thus, in general, the term "routing track" may be used to describe an electrically conductive element isolated by an insulator material (e.g., an insulator material typically comprising a low-k dielectric) that is provided in a plane parallel to the plane of an IC die/chip or a support structure over which an IC structure is provided, while the term "via" may be used to describe an electrically conductive element that interconnects two or more routing tracks of different levels of a metallization stack, or a component of the transistor layer and one or more routing tracks of a metallization layer. To that end, a via may be provided substantially perpendicularly to the plane of an IC die/chip or a support structure over which an IC structure is provided and may interconnect two routing tracks in adjacent levels, two routing tracks in not adjacent levels, and/or a component of a transistor layer and a routing track in adjacent or not adjacent layers. The routing tracks are sometimes referred to as "electrically conductive lines" (or, simply, "lines") or "electrically conductive trenches" (or, simply, "trenches"). Sometimes, routing tracks and vias may be referred to as "metal tracks/lines/traces" and "metal vias", respectively, to highlight the fact that these elements include electrically conductive materials such as, but not limited to, metals. Together, routing tracks and vias may be referred to as "interconnects," where the term "interconnect" may be used to describe any element formed of an electrically conductive material for providing electrical connectivity to/from one or more components associated with an IC or/and between various such components.

As the foregoing illustrates, both FinFETs and nanoribbon transistors are built based on elongated semiconductor structures (in the following referred to, simply, as "elongated structures"), e.g., fins or nanoribbons, respectively. A longitudinal axis of such an elongated structure may be defined as an axis that includes a line along the direction of carrier transport between source and drain regions of the transistor. Typically, such an axis is substantially parallel to the support structure on/in which a transistor resides and is one of lines of symmetry for the elongated structure of the transistor (at least for the idealized version of the transistor that does not reflect unintended manufacturing variations that may affect the real-life geometry of the transistor). Conventionally, FinFETs and nanoribbon transistors are oriented on a support structure so that the direction of their carrier transport (which direction may be represented by the longitudinal axes of their elongated structures), is parallel to the front and back faces/planes of the support structure and is either perpendicular or parallel to different edges of the support structure, in particular, being either perpendicular or parallel to different edges of the front face or the back face of the support structure. The gates of such transistors are then oriented so that an angle between a projection of a gate of a given transistor onto a plane of the support structure and a projection of the longitudinal axis of an elongated structure onto said plane is 90 degrees (e.g., the gates extend in directions perpendicular to longitudinal axes of elongated structures). In such conventional implementations, the routing tracks are also oriented on a support structure to that they are either perpendicular or parallel to different edges of the support structure.

In contrast to such conventional implementations, embodiments of the present disclosure provide IC devices with angled transistors and angled routing tracks. As used herein, a transistor is referred to as an "angled transistor" if the direction of carrier transport of the transistor is neither perpendicular nor parallel to any edges of the front face or the back face of a support structure (e.g., a die) over which the transistor is implemented. For example, a transistor may be described as an "angled transistor" if an angle between a projection of the elongated structure of the transistor onto a plane of the support structure and one or more of the edges of the support structure is neither 0 degrees, no 90 degrees, e.g., between about 10 degrees and 80 degrees. Similarly, a routing track is referred to as an "angled routing track" if the routing track is neither perpendicular nor parallel to any edges of front or back faces of the support structure over which the transistor and the routing track are implemented, e.g., if an angle between a projection of the routing track onto a plane of the support structure and one or more of the edges of the support structure is between about 10 degrees and 80 degrees. Since, in geometry, not just one but two angles may be defined among any two lines crossing one another when the angles are defined as measured clockwise or counterclockwise with respect to one of the lines, the two such angles adding together to be 180 degrees, for the angled transistors and angled routing tracks described herein the angles refer to the smaller of the two angles. When a transistor is implemented as an angled transistor, the gate of the transistor may still be aligned with the edges of the support structure (e.g., be either perpendicular or parallel to the support structure), which means that the gate is non-angled with respect to the edges of the support structure but is angled with respect to the direction of carrier transport of the transistor. Alternatively, the gate of the transistor may also be angled with respect to the edges of the support structure, as long as it remains angled (e.g., not perpendicular) with respect to the direction of carrier transport of the transistor. Embodiments of the present disclosure are based on recognition that implementing transistors as angled transistors with gates that are angled with respect to the direction of carrier transport of the transistors, means that, for a given width of an elongated structure of the transistor, the effective cross-section over which the carriers may be transported between source and drain is increased (e.g., the cross-section of the gates in the x-z plane of the example coordinate system illustrated in the present drawings), advantageously resulting in an increased drive current. Conversely, implementing transistors as angled transistors with gates that are angled with respect to the direction of carrier transport of the transistors may advantageously allow reducing the widths of the elongated structures of the transistors, thus reducing footprints of transistors, while keeping the drive current substantially matched to what it would have been without angling. Aligning the routing tracks with the angled transistors, thus implementing the routing track as angled routing tracks, allows more efficient routing of signals and power to angled transistors. Thus, angled transistors and angled routing tracks provide a promising way to increasing densities of transistors on the limited real estate of semiconductor chips and/or decreasing adverse effects associated with continuous scaling of IC components.

Embodiments of the present disclosure are further based on recognition that IC devices with angled transistors and angled routing tracks may be optimized even further if transistors are to be operated at relatively low temperatures, where, as used herein, low-temperature operation (or "lower-temperature" operation) refers to operation at temperatures below room temperature, e.g., below 200 Kelvin degrees or lower. Thermal energy is much lower at low temperatures and, consequently, the off-current (Ioff) of a transistor is much lower and the subthreshold swing is much sharper, compared to room temperature operation. Consequently, if a transistor is operated at low temperatures, its gate length can be shorter than what can be achieved at room temperatures, while keeping the short-channel effects at a level that does not significantly compromise transistor performance. As a result, at low temperatures, it may be possible to further decrease footprints of the transistor arrangements described herein, thereby decreasing their effective gate lengths, while still maintaining adequate performance. Although in the following, descriptions are provided with respect to FinFETs and nanoribbon transistors, embodiments of the present disclosure, in particular angled transistors and angled routing tracks, are applicable to transistors of other architectures, such as planar transistors.

In the following detailed description, various aspects of the illustrative implementations may be described using terms commonly employed by those skilled in the art to convey the substance of their work to others skilled in the art. For example, since, as is common in the field of FETs, designations of "source" and "drain" are often interchangeable, source and drain regions of a transistor may be referred to as first and second source or drain (S/D) region, where, in some embodiments, the first S/D region is a source region and the second S/D region is a drain region and, in other embodiments, this designation of source and drain region is reversed. Analogous applies to S/D contacts of a transistor. In another example, as used herein, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. If used, the terms "oxide," "carbide," "nitride," "sulfide," etc. refer to compounds containing, respectively, oxygen, carbon, nitrogen, sulfur, etc., the term "high-k dielectric" refers to a material having a higher dielectric constant (k) than silicon oxide, while the term "low-k dielectric" refers to a material having a lower k than silicon oxide. The terms "substantially," "close," "approximately," "near," and "about," generally refer to being within +/−10%, e.g., within +/−5% or within +/−2%, of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−8% of a target value, e.g., within +/−5% of a target value or within +/−2% of a target value, based on the context of a particular value as described herein or as known in the art.

The term "interconnect" may refer to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term "interconnect." The nature of the interconnect being described is to be understood herein with reference to the signal medium associated therewith. Thus, when used with reference to an electronic device, such as an IC that operates using electrical signals, the term "interconnect" describes any element formed of an electrically conductive material for providing electrical connectivity to one or more elements associated with the IC or/and between various such elements. In such cases, the term "interconnect" may refer to both conductive traces (also sometimes referred to as "metal traces," "lines," "metal lines," "wires," "metal wires," "trenches," or "metal trenches") and conductive vias (also sometimes referred to as "vias" or "metal vias"). Sometimes, electrically conductive traces and vias may be referred to as "conductive traces" and "conductive vias", respectively, to highlight the fact that these elements include electrically conductive materials such as metals. Likewise, when used with reference to a device that operates on optical signals as well, such as a photonic IC (PIC), "interconnect" may also describe any element formed of a material that is optically conductive for providing optical connectivity to one or more elements associated with the PIC. In such cases, the term "interconnect" may refer to optical waveguides (e.g., structures that guide and confine light waves), including optical fiber, optical splitters, optical combiners, optical couplers, and optical vias. The term "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket, or portion of a conductive line or via).

The terms "over," "under," "between," and "on" as used herein refer to a relative spatial position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description may use the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, analogous elements designated in the present drawings with different reference numerals after a dash, e.g., edges 303-1, 303-2, 303-3, and 303-4 may be collectively referred to together without the reference numerals after the dash, e.g., as "edges 303." In order to not clutter the drawings, if multiple instances of certain elements are illustrated in a given drawing, only some of the elements may be labeled with a reference sign. A plurality of drawings with the same number and different letters may be referred to without the letters, e.g., FIGS. 4A-4D may be referred to as "FIG. 4."

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Inspection of layout and mask data and reverse engineering of parts of a device to reconstruct the circuit using e.g., optical microscopy, TEM, or SEM, and/or inspection of a cross-section of a device to detect the shape and the location of various device elements described herein using, e.g., Physical Failure Analysis (PFA) would allow determination of presence of IC devices with angled transistors and angled routing tracks as described herein.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various IC devices with angled transistors and angled routing tracks as described herein may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

FIG. 1 provides a perspective view of an example IC device 100 implementing a nanoribbon transistor 110, in accordance with some embodiments. The nanoribbon transistor 110 is one example of a transistor that may be implemented as an angled transistor with a gate angled with respect to the direction of carrier transport in the transistor, the angled transistor coupled to one or more angled routing tracks as described herein. Because FIG. 1 is provided to assist explanations of what, in general, a nanoribbon transistor is, it does not illustrate a gate angled with respect to the direction of carrier transport of the transistor 110. Rather, FIG. 1 shows a conventional gate that is not angled with respect to the direction of carrier transport of the transistor, with subsequent drawings showing illustrations of angled transistors (e.g., FIG. 3, FIG. 5A, FIG. 6A, FIG. 7A, and FIG. 8A).

Turning to the details of FIG. 1, the IC device 100 may include a semiconductor material, which may include one or more semiconductor materials, formed as a nanoribbon 104 (e.g., an elongated structure) extending substantially parallel to a support structure 102. The transistor 110 may be formed on the basis of the nanoribbon 104 by having a gate stack 106 at least partially wrap around a portion of the nanoribbon referred to as a "channel region" and by having source and drain regions, shown in FIG. 1 as a first S/D region 114-1 and a second S/D region 114-2, on either side of the gate stack 106. In some embodiments, a layer of oxide material (not specifically shown in FIG. 1) may be provided between the support structure 102 and the gate stack 106.

The IC device 100 shown in FIG. 1, as well as IC devices shown in other drawings of the present disclosure, are intended to show some of the components therein, and these IC devices, or portions thereof, may include other components that are not illustrated. For example, although not specifically illustrated in FIG. 1, a dielectric spacer may be provided between a first S/D contact (not shown in FIG. 1) that may be coupled to a first S/D region 114-1 of the transistor 110 and the gate stack 106 as well as between a second S/D contact (also not shown in FIG. 1) that may be coupled to a second S/D region 114-2 of the transistor 110 and the gate stack 106 in order to provide electrical isolation between the source, gate, and drain contacts (in general, such contacts may also be referred to as "electrodes"). In another example, although not specifically illustrated in FIG. 1, at least portions of the transistor 110 may be surrounded in an insulator material, such as any suitable interlayer dielectric (ILD) material. In some embodiments, such an insulator material may be a high-k dielectric including elements such as hafnium, silicon, oxygen, titanium, tantalum, lanthanum, aluminum, zirconium, barium, strontium, yttrium, lead, scandium, niobium, and zinc. Examples of high-k materials that may be used for this purpose may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In other embodiments, the insulator material surrounding portions of the transistor 110 may be a low-k dielectric material. Some examples of low-k dielectric materials include, but are not limited to, silicon dioxide, carbon-doped oxide, silicon nitride, organic polymers such as perfluorocyclobutane or polytetrafluoroethylene, fused silica glass (FSG), and organosilicates such as silsesquioxane, siloxane, or organosilicate glass. Similar considerations are applicable to other IC devices shown in the present drawings, e.g., those shown in FIGS. 2-3 and FIGS. 5-8.

Implementations of the present disclosure may be formed or carried out on any suitable support structure 102, such as a substrate, a die, a wafer, or a chip. The support structure 102 may, e.g., be the wafer 2000 of FIG. 9, discussed below, and may be, or be included in, a die, e.g., the singulated die 2002 of FIG. 9, discussed below. The support structure 102 may be a semiconductor substrate composed of semiconductor material systems including, for example, N-type or P-type materials systems. In one implementation, the semiconductor substrate may be a crystalline substrate formed using a bulk silicon or a silicon-on-insulator (SOI) substructure. In other implementations, the semiconductor substrate may be formed using alternate materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-V materials (e.g., materials from groups III and V of the periodic system of elements), group II-VI (e.g., materials from groups II and IV of the periodic system of elements), or group IV materials (e.g., materials from group IV of the periodic system of elements). In some embodiments, the substrate may be non-crystalline. In some embodiments, the support structure 102 may be a printed circuit board (PCB) substrate. Although a few examples of materials from which the support structure 102 may be formed are described here, any material that may serve as a foundation upon which an IC device with angled transistors and angled routing tracks as described herein may be built falls within the spirit and scope of the present disclosure. As used herein, the term "support structure" does not necessarily mean that it provides mechanical support for the IC devices/structures (e.g., transistors, capacitors, interconnects, and so on) built thereon. For example, some other structure (e.g., a carrier substrate or a package substrate) may provide such mechanical support and the support structure 102 may provide material "support" in that, e.g., the IC devices/structures are build based on the semiconductor materials of the support structure 102. However, in some embodiments, the support structure 102 may provide mechanical support.

The nanoribbon 104 may take the form of a nanowire or nanoribbon, for example. In some embodiments, an area of a transverse cross-section of the nanoribbon 104 (e.g., an area in the x-z plane of the example coordinate system x-y-z shown in FIG. 1) may be between about 25 and 10000 square nanometers, including all values and ranges therein (e.g., between about 25 and 1000 square nanometers, or between about 25 and 500 square nanometers). The transverse cross-section of the nanoribbon 104 is cross-section along a plane perpendicular to a longitudinal axis 120 of the nanoribbon 104, where the longitudinal axis 120 may, e.g., be along the y-axis of the example coordinate system shown in FIG. 1. In some embodiments, a width of the nanoribbon 104 (e.g., a dimension measured in a plane parallel to the support structure 102 and in a direction perpendicular to the longitudinal axis 120, e.g., along the x-axis of the example coordinate system shown FIG. 1) may be at least about 3 times larger than a thickness (or a "height") of the nanoribbon 104 (e.g., a dimension measured in a plane perpendicular to the support structure 102, e.g., along the z-axis of the example coordinate system shown in FIG. 1), including all values and ranges therein, e.g., at least about 4 times larger, or at least about 5 times larger. It should be noted that FIG. 1 illustrates the x-y-z coordinate system being aligned so that the longitudinal axis 120 is along the y-axis and the gate being aligned along the x-axis only for the ease of explanations of this particular drawing. However, for nanoribbon transistors that are implemented as angled transistors as described herein, the longitudinal axis 120 would be in the x-y plane but angled (e.g., at an angle between about 10 and 80 degrees) with respect to the y-axis.

Although the nanoribbon 104 illustrated in FIG. 1 is shown as having a rectangular cross-section, the nanoribbon 104 may instead have a cross-section that is rounded at corners or otherwise irregularly shaped, and the gate stack 106 may conform to the shape of the nanoribbon 104. The terms "front face" and "back face" of a nanoribbon may refer to the faces of the nanoribbon 104 that are substantially parallel to the support structure 102, the term "sidewall" (or "side face") of a nanoribbon may refer to the opposing faces of the nanoribbon 104 that are substantially perpendicular to the support structure 102 and extend in a direction of the longitudinal axis 120 of the nanoribbon 104, while the term "end" of a nanoribbon may refer to the opposing faces of the nanoribbon 104 that are substantially perpendicular to the longitudinal axis 120 of the nanoribbon 104.

The nanoribbon 104 may be formed of one or more semiconductor materials, together referred to as a "channel material." In general, channel materials of any of the angled transistors described herein, e.g., the channel material of the transistor 110, may be composed of semiconductor material systems including, for example, N-type or P-type materials systems. In some embodiments, the channel material may include a substantially monocrystalline semiconductor, such as silicon (Si) or germanium (Ge). In some embodiments, the channel material may include a compound semiconductor with a first sub-lattice of at least one element from group III of the periodic table (e.g., Al, Ga, In), and a second sub-lattice of at least one element of group V of the periodic table (e.g., P, As, Sb). In some embodiments, the channel material may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the channel material may include a combination of semiconductor materials.

For some example N-type transistor embodiments (e.g., for the embodiments where the transistor in which the channel material is included is an N-type metal-oxide-semiconductor (NMOS) transistor), the channel material may include a III-V material having a relatively high electron mobility, such as, but not limited to InGaAs, InP, InSb, and InAs. For some such embodiments, the channel material may be a ternary III-V alloy, such as InGaAs, GaAsSb, InAsP, or InPSb. For some $In_xGa_{1-x}As$ fin embodiments, In content (x) may be between 0.6 and 0.9, and may advantageously be at least 0.7 (e.g., $In_{0.7}Ga_{0.3}$ As). For some example P-type transistor embodiments (e.g., for the embodiments where the transistor in which the channel material is included is a P-type metal-oxide-semiconductor (PMOS) transistor), the channel material may advantageously be a group IV material having a high hole mobility, such as, but not limited to Ge or a Ge-rich SiGe alloy. For some example embodiments, the channel material may have a Ge content between 0.6 and 0.9, and advantageously may be at least 0.7.

In some embodiments, the channel material may be a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the channel material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphite, and black phosphorus, each of which may possibly be doped with one or more of gallium, indium, aluminum, fluorine, boron, phosphorus, arsenic, nitrogen, tantalum, tungsten, and magnesium, etc.

As noted above, the channel material may include IGZO. IGZO-based devices have several desirable electrical and manufacturing properties. IGZO has high electron mobility compared to other semiconductors, e.g., in the range of 20-50 times than amorphous silicon. Furthermore, amorphous IGZO (a-IGZO) transistors are typically characterized by high band gaps, low-temperature process compatibility, and low fabrication cost relative to other semiconductors. IGZO can be deposited as a uniform amorphous phase while retaining higher carrier mobility than oxide semiconductors such as zinc oxide. Different formulations of IGZO include different ratios of indium oxide, gallium oxide, and zinc oxide. One particular form of IGZO has the chemical formula $InGaO_3(ZnO)_5$. Another example form of IGZO has an indium:gallium:zinc ratio of 1:2:1. In various other examples, IGZO may have a gallium to indium ratio of 1:1, a gallium to indium ratio greater than 1 (e.g., 2:1, 3:1, 4:1, 5:1, 6:1, 7:1, 8:1, 9:1, or 10:1), and/or a gallium to indium ratio less than 1 (e.g., 1:2, 1:3, 1:4, 1:5, 1:6, 1:7, 1:8, 1:9, or 1:10). IGZO can also contain tertiary dopants such as aluminum or nitrogen.

In some embodiments, any of the transistors that may be implemented as angled transistors as described herein, e.g., the transistor 110, may be a thin-film transistor (TFT). A TFT is a special kind of a FET made by depositing active semiconductor material over a support (e.g., a support structure as described above) that may be a non-conducting support. Some such materials may be deposited at relatively low temperatures, which allows depositing them within the thermal budgets imposed on back-end fabrication to avoid damaging the front-end components such as the logic devices of an IC device in which the transistor may be included. Thus, in some embodiments, the channel material of any of the transistors that may be implemented to have angled gates described herein, e.g., the transistor 110, may be a semiconductor material deposited at relatively low temperatures, and may include any of the oxide semiconductor materials described above.

In other embodiments, instead of being deposited at relatively low temperatures as described above with reference to the TFTs, the channel material of any of the transistors that may be implemented as angled transistors as described herein, e.g., the transistor 110, may be epitaxially grown in what typically involves relatively high-temperature processing. In such embodiments, the channel material may include any of the semiconductor materials described above, including oxide semiconductor materials. In some such embodiments, the channel material may be epitaxially grown directly on a semiconductor layer of a support structure over which the transistor will be fabricated, in a process known as "monolithic integration." In other such embodiments, the channel material of any of the transistors that may be implemented as angled transistors as described herein, e.g., the transistor 110, may be epitaxially grown on a semiconductor layer of another support structure and then the epitaxially grown layer of the channel material may be transferred, in a process known as a "layer transfer," to a support structure over which the transistor will reside, in which case the latter support structure may but does not have to include a semiconductor layer prior to the layer transfer. Layer transfer advantageously allows forming transistors, such as FinFETs or nanoribbon transistors, over support structures or in layers that do not include semiconductor materials (e.g., in the back end of an IC device). Layer transfer also advantageously allows forming transistors of any architecture (e.g., non-planar or planar transistors) without imposing the negative effects of the relatively high-temperature epitaxial growth process on devices that may already be present over a support structure.

A channel material that is deposited at relatively low temperatures is typically a polycrystalline, polymorphous, or amorphous semiconductor, or any combination thereof. A channel material that is epitaxially grown is typically a highly crystalline (e.g., monocrystalline or single-crystal-line) material. Therefore, whether the channel material of any of the transistors described herein, is deposited at relatively low temperatures or epitaxially grown can be identified by inspecting grain size of the active portions of the channel material (e.g., of the portions of the channel material that form channels of transistors). An average grain size of a channel material of a transistor being between about 0.5 and 1 millimeters (in which case the material may be polycrystalline) or smaller than about 0.5 millimeter (in which case the material may be polymorphous or amorphous) may be indicative of the channel material having been deposited (e.g., if the transistor in which such a channel material is included is a TFT). On the other hand, an average grain size of a channel material of a transistor being equal to or greater than about 1 millimeter (in which case the material may be a single-crystal material) may be indicative of the channel material having been epitaxially grown and included in the final device either by monolithic integration or by layer transfer.

In some embodiments, the channel material of any of the transistors that may be implemented as angled transistors as described herein, e.g., the transistor 110, may include a two-dimensional (2D) semiconductor material, e.g., a semiconductor material with a thickness of a few nanometers or less, where electrons in the material are free to move in the 2D plane but their restricted motion in the third direction is governed by quantum mechanics. In some such embodiments, such a channel material may include a single atomic monolayer of a 2D semiconductor material, while, in other such embodiments, such a channel material may include five or more atomic monolayers of a 2D semiconductor material. Examples of 2D materials that may be used to implement the channel material of any of the transistors that may be implemented as angled transistors as described herein include, but are not limited to, graphene, hexagonal boron nitride, or transition-metal chalcogenides.

A gate stack 106 including a gate electrode material 108 and, optionally, a gate insulator 112, may wrap entirely or almost entirely around a portion of the nanoribbon 104 as shown in FIG. 1, with the channel region of the transistor 110 being the active region (channel region) of the channel material in the portion of the nanoribbon 104 wrapped by the gate stack 106. The gate insulator 112 is not shown in the perspective drawing of the IC device 100 shown in FIG. 1 but is shown in an inset 130 of FIG. 1, providing a cross-sectional side view of a portion of the nanoribbon 104 with a gate stack 106 wrapping around it. As shown in FIG. 1, the gate insulator 112 may wrap around a transversal portion/cross-section of the nanoribbon 104, and the gate electrode material 108 may wrap around the gate insulator 112.

The gate electrode material 108 may include at least one P-type work function metal or N-type work function metal, depending on whether the transistor 110 is a PMOS transistor or an NMOS transistor. P-type work function metal may be used as the gate electrode material 108 when the transistor 110 is a PMOS transistor and N-type work function metal may be used as the gate electrode material 108 when the transistor 110 is an NMOS transistor. For a PMOS transistor, metals that may be used for the gate electrode material 108 may include, but are not limited to, ruthenium, palladium, platinum, cobalt, nickel, and conductive metal oxides (e.g., ruthenium oxide). For an NMOS transistor, metals that may be used for the gate electrode material 108 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode material 108 may include a stack of two or more metal layers, where one or more metal layers are work function metal layers and at least one metal layer is a fill metal layer. Further layers may be included next to the gate electrode material 108 for other purposes, such as to act as a diffusion barrier layer or/and an adhesion layer.

In some embodiments, the gate insulator 112 may include one or more high-k dielectrics including any of the materials discussed herein with reference to the insulator material that may surround portions of the transistor 110. In some embodiments, an annealing process may be carried out on the gate insulator 112 during manufacture of the transistor 110 to improve the quality of the gate insulator 112. The gate insulator 112 may have a thickness that may, in some embodiments, be between about 0.5 nanometers and 3 nanometers, including all values and ranges therein (e.g., between about 1 and 3 nanometers, or between about 1 and 2 nanometers), although, in other embodiments, the thickness of the gate insulator 112 may be greater than 3 nanometers. In some embodiments, the gate stack 106 may be surrounded by a gate spacer, not shown in FIG. 1. Such a gate spacer would be configured to provide separation between the gate stack 106 and source/drain contacts of the transistor 110 and could be made of a low-k dielectric material, some examples of which have been provided above. A gate spacer may include pores or air gaps to further reduce its dielectric constant.

In some embodiments, the gate insulator 112 may include a hysteretic material or a hysteretic arrangement, which, together, may be referred to as a "hysteretic element." Transistors 110 in which the gate insulator 124 includes a hysteretic element may be described as "hysteretic transistors" and may be used to implement hysteretic memory. Hysteretic memory refers to a memory technology employing hysteretic materials or arrangements, where a material or an arrangement may be described as hysteretic if it exhibits the dependence of its state on the history of the material (e.g., on a previous state of the material). Ferroelectric (FE) and antiferroelectric (AFE) materials are examples of hysteretic materials. Layers of different materials arranged in a stack to exhibit charge-trapping phenomena is an example of a hysteretic arrangement.

A FE or an AFE material is a material that exhibits, over some range of temperatures, spontaneous electric polarization, e.g., displacement of positive and negative charges from their original position, where the polarization can be reversed or reoriented by application of an electric field. In particular, an AFE material is a material that can assume a state in which electric dipoles from the ions and electrons in the material may form a substantially ordered (e.g., substantially crystalline) array, with adjacent dipoles being oriented in opposite (antiparallel) directions (e.g., the dipoles of each orientation may form interpenetrating sub-lattices, loosely analogous to a checkerboard pattern), while a FE material is a material that can assume a state in which all of the dipoles point in the same direction. Because the displacement of the charges in FE and AFE materials can be maintained for some time even in the absence of an electric field, such materials may be used to implement memory cells. Because the current state of the electric dipoles in FE and AFE materials depends on the previous state, such materials are hysteretic materials. Memory technology where logic states are stored in terms of the orientation of electric dipoles in (e.g., in terms of polarization of) FE or AFE materials is referred to as "FE memory," where the term "ferroelectric" is said to be adopted to convey the similarity of FE memories to ferromagnetic memories, even though there is typically no iron (Fe) present in FE or AFE materials.

A stack of alternating layers of materials that is configured to exhibit charge-trapping is an example of a hysteretic arrangement. Such a stack may include as little as two layers of materials, one of which is a charge-trapping layer (e.g., a layer of a material configured to trap charges when a volage is applied across the material) and the other one of which is a tunneling layer (e.g., a layer of a material through which the charge is to be tunneled to the charge-trapping layer). The tunneling layer may include an insulator material such as a material that includes silicon and oxygen (e.g., silicon oxide), or any other suitable insulator. The charge-trapping layer may include a metal or a semiconductor material that is configured to trap charges. Because the trapped charges may be kept in a charge-trapping arrangement for some time even in the absence of an electric field, such arrangements may be used to implement memory cells. Because the presence and/or the number of trapped charges in a charge-trapping arrangement depends on the previous state, such arrangements are hysteretic arrangements. Memory technology where logic states are stored in terms of the amount of charge trapped in a hysteretic arrangement may be referred to as "charge-trapping memory."

Hysteretic memories have the potential for adequate non-volatility, short programming time, low power consumption, high endurance, and high-speed writing. In addition, hysteretic memories may be manufactured using processes compatible with the standard complementary metal-oxide-semiconductor (CMOS) technology. Therefore, over the last few years, these types of memories have emerged as promising candidates for many growing applications.

In some embodiments, the hysteretic element of the gate insulator 112 may be provided as a layer of a FE or an AFE material. Such an FE/AFE material may include one or more materials that can exhibit sufficient FE/AFE behavior even at thin dimensions, e.g., such as an insulator material at least about 5%, e.g., at least about 7% or at least about 10%, of which is in an orthorhombic phase and/or a tetragonal phase (e.g., as a material in which at most about 95-90% of the material may be amorphous or in a monoclinic phase). For example, such materials may be based on hafnium and oxygen (e.g., hafnium oxides), with various dopants added to ensure sufficient amount of an orthorhombic phase or a tetragonal phase. Some examples of such materials include materials that include hafnium, oxygen, and zirconium (e.g., hafnium zirconium oxide (HfZrO, also referred to as HZO)), materials that include hafnium, oxygen, and silicon (e.g., silicon-doped (Si-doped) hafnium oxide), materials that include hafnium, oxygen, and germanium (e.g., germanium-doped (Ge-doped) hafnium oxide), materials that include hafnium, oxygen, and aluminum (e.g., aluminum-doped (Al-doped) hafnium oxide), and materials that include hafnium, oxygen, and yttrium (e.g., yttrium-doped (Y-doped) hafnium oxide). However, in other embodiments, any other materials which exhibit FE/AFE behavior at thin dimensions may be used as the hysteretic element and are within the scope of the present disclosure.

In other embodiments, the hysteretic element of the gate insulator 112 may be provided as a stack of alternating layers of materials that can trap charges. In some such embodiments, the stack may be a two-layer stack, where one layer is a charge-trapping layer and the other layer is a tunneling layer. The tunneling layer may include an insulator material such as a material that includes silicon and oxygen (e.g., silicon oxide), or any other suitable insulator. The charge-trapping layer may include an electrically conductive material such as a metal, or a semiconductor material. In some embodiments, the charge-trapping layer may include a sub-stoichiometric material (e.g., a material that includes less than a stochiometric amount of a reagent). The sub-stoichiometric material may include vacancies in concentration of at least about $10^{18}$ vacancies per cubic centimeter, e.g., in concentration between about $10^{18}$ vacancies per cubic centimeter and about $10^{22}$ -$10^{23}$ vacancies per cubic centimeter. As known in the art, vacancies refer to cites where atoms (e.g., oxygen or nitrogen) that should be present are missing, thus providing a defect in a material. For example, the sub-stoichiometric material of any of the hysteretic elements described herein may include oxygen and the vacancies may be oxygen vacancies, or the sub-stoichiometric material may include nitrogen and the vacancies may be nitrogen vacancies. During operation, charges may be trapped in the vacancies of the sub-stoichiometric material. Thus, implementing a sub-stoichiometric material with vacancies is one way to provide a charge-trapping layer of a hysteretic arrangement. In general, any material that has defects that can trap charge may be used in/as a charge-trapping layer. Such defects are very detrimental to operation of logic devices and, therefore, typically, deliberate steps need to be taken to avoid presence of the defects. However, for memory devices, such defects may be desirable because charge-trapping may be used to represent different memory states of a memory cell.

In some embodiments of the hysteretic element being provided as a stack of alternating layers of materials that can trap charges, the stack may be a three-layer stack where an insulator material is provided on both sides of a charge-trapping layer. In such embodiments, a layer of an insulator material on one side of the charge-trapping layer may be referred to as a "tunneling layer" while a layer of an insulator material on the other side of the charge-trapping layer may be referred to as a "field layer."

In various embodiments of the hysteretic element being provided as a stack of alternating layers of materials that can trap charges, a thickness of each layer the stack may be between about 0.5 and 10 nanometers, including all values and ranges therein, e.g., between about 0.5 and 5 nanometers. In some embodiment of a three-layer stack, a thickness of each layer of the insulator material may be about 0.5 nanometers, while a thickness of the charge-trapping layer may be between about 1 and 8 nanometers, e.g., between about 2.5 and 7.5 nanometers, e.g., about 5 nanometers. In some embodiments, a total thickness of the hysteretic element provided as a stack of alternating layers of materials that can trap charges (e.g., a hysteretic arrangement) may be between about 1 and 10 nanometers, e.g., between about 2 and 8 nanometers, e.g., about 6 nanometers.

Turning to the S/D regions 114 of the transistor 110, in some embodiments, the S/D regions may be highly doped, e.g., with dopant concentrations of about $10^{21}$ dopants per cubic centimeter, in order to advantageously form Ohmic contacts with the respective S/D electrodes, although these regions may also have lower dopant concentrations and may form Schottky contacts in some implementations. Irrespective of the exact doping levels, the S/D regions of a transistor may be the regions having dopant concentration higher than in other regions, e.g., higher than a dopant concentration in the channel region (e.g., in a channel material extending between the first S/D region 114-1 and the second S/D region 114-2), and, therefore, may be referred to as "highly doped" (HD) regions. The channel region of the transistor 110 may include semiconductor materials with doping concentrations significantly smaller than those of the S/D regions 114.

The S/D regions 114 of the transistor 110 may generally be formed using either an implantation/diffusion process or an etching/deposition process. In the former process, dopants such as boron, aluminum, antimony, phosphorous, or arsenic may be ion-implanted into the nanoribbon 104 to form the source and drain regions. An annealing process that activates the dopants and causes them to diffuse further into the nanoribbon 104 may follow the ion implantation process. In the latter process, portions of the nanoribbon 104 may first be etched to form recesses at the locations of the future S/D regions 114. An epitaxial deposition process may then be carried out to fill the recesses with material that is used to fabricate the S/D regions 114. In some implementations, the S/D regions 114 may be fabricated using a silicon alloy such as silicon germanium or silicon carbide. In some implementations, the epitaxially deposited silicon alloy may be doped in situ with dopants such as boron, arsenic, or phosphorous. In further embodiments, the S/D regions 114 may be formed using one or more alternate semiconductor materials such as germanium or a group III-V material or alloy. And in further embodiments, one or more layers of metal and/or metal alloys may be used to form the S/D regions 114. In some embodiments, a distance between the first and second S/D regions 114 (e.g., a dimension measured along the longitudinal axis 120 of the nanoribbon 104) may be between about 5 and 40 nanometers, including all values and ranges therein (e.g., between about 22 and 35 nanometers, or between about 20 and 30 nanometers).

In some embodiments, angled transistors and angled routing tracks described herein may be implemented in memory arrays. In some such embodiments, an angled transistor may be coupled to a storage element, thus forming a 1T-1X memory cell of a memory array, where "1T" in the term "1T-1X memory cell" indicates that the memory cell includes one transistor (T), and where "1X" in the term "1T-1X memory cell" indicates that the memory cell includes one storage element (X). In other embodiments, an angled transistor may be coupled to multiple storage elements, or an angled transistor may be coupled to another transistor, to form one or more memory cells of a memory array, all of which being within the scope of the present disclosure. Generally, a storage element may be any suitable IC component that can be programmed to a target data state (e.g., corresponding to a particular charged stored on the storage element or corresponding to a particular resistance state of the storage element) by applying an electric field or energy (e.g., positive or negative voltage or current pulses) to the storage element for a particular duration. In various embodiments, a storage element may be a capacitor, a resistive storage element, a resistive random-access memory (RRAM) device, a metal filament memory device, a phase change memory (PCM) device, a magnetic random-access memory (MRAM) device, etc.

An example of using the transistor 110 as a part of a memory cell is illustrated in FIG. 1, showing that the IC device 100 may include a memory cell 160 that includes the transistor 110 and a storage element 166, electrically coupled to the S/D region 114-2. In various embodiments, the storage element 166 may include one of a capacitor, a magnetoresistive material, a ferroelectric material, or a resistance-changing material. In some embodiments, the storage element 166 may include two electrodes 167-1 and 167-2, separated by a memory material 169. One example of the electrodes 167 and the memory material 169 of the storage element 166 is schematically illustrated within the dashed contour of an inset 162 of FIG. 1, although, in other embodiments, the spatial arrangement of the memory material 169 and the electrodes 167 may be different as long as the memory material 169 is spatially between the electrode 167-1 and the electrode 167-2 (e.g., the memory material 169 does not have to be a planar layer but may be arranged in any kind of a three-dimensional arrangement). The memory material 169 may be any suitable material that can put into a target state by applying an electric field or energy (e.g., positive or negative voltage or current pulses) to one or both electrodes 167 of the storage element 166 for a particular duration, thus programming the storage element 166 to a target data state (e.g., corresponding to a particular charged stored on the storage element 166 or corresponding to a particular resistance state of the storage element 166). Such a storage element 166 may be electrically coupled to the S/D region 114-2 by coupling the electrode 167-1 of the storage element 166 to the S/D region 114-2 (e.g., in some embodiments, the electrode 167-1 of the storage element 166 and a contact to the S/D region 114-2 may be a shared contact of a suitable electrically conductive material).

As an example, a dynamic random-access memory (DRAM) cell may include a storage element 166 in a form of a capacitor for storing a bit value, or a memory state (e.g., logical "1" or "0") of the cell, and an access transistor, implemented as the transistor 110, controlling access to the cell (e.g., access to write information to the cell or access to read information from the cell). Such a memory cell may be referred to as a "1T-1C memory cell," highlighting the fact that it uses one transistor (e.g., "1T" in the term "1T-1C memory cell") and one capacitor (e.g., "1C" in the term "1T-1C memory cell"). In such embodiments, the electrodes 167 may be capacitor electrodes, and the memory material 169 may be a capacitor insulator. In some embodiments, the memory material 169 of such a capacitor may be a dielectric material. In other embodiments, the memory material 169 of such a capacitor may be a hysteretic element, e.g., as described above with reference to the embodiments where the gate insulator 112 is a hysteretic element.

In another example, the storage element 166 may be a resistive storage element (also referred to herein as a "resistive switch") that includes the memory material 169 that is a resistance-changing material, e.g., during operation the memory material 169 can be switched between two different nonvolatile states: a high resistance state (HRS) and a low resistance state (LRS). The state of a resistive storage element may be used to represent a data bit (e.g., logical "1" for HRS and logical "0" for LRS, or vice versa). A resistive storage element may have a voltage threshold beyond which the resistive storage element is in the LRS; driving a resistive storage element into the LRS may be referred to as SET (with an associated SET threshold voltage). Similarly, a resistive storage element may have a voltage threshold beyond which the resistive storage element is in the HRS; driving a resistive storage element into the HRS may be referred to as RESET (with an associated RESET threshold voltage).

In another example, the storage element 166 may be a RRAM device; in such embodiments, the memory material 169 may include an oxygen exchange layer (e.g., hafnium) and an oxide layer, as known in the art.

In yet another example, the storage element 166 may be a metal filament memory device (e.g., a conductive bridging random-access memory (CBRAM) device); in such embodiments, the memory material 169 may include a solid electrolyte, and one of the electrodes 167 of the storage element 166 may be an electrochemically active material (e.g., silver or copper), and the other of the electrodes 167 of the storage element 166 may be an inert material (e.g., an inert metal), as known in the art. A chemical barrier layer (e.g., tantalum, tantalum nitride, or tungsten) may be disposed between the electrochemically active electrode and the solid electrolyte to mitigate diffusion of the electrochemically active material into the solid electrolyte, in some such embodiments.

In some embodiments, the storage element 166 may be a PCM device; in such embodiments, the memory material 169 may include a chalcogenide or other phase change memory material.

In some embodiments, the storage element 166 may be a MRAM device; in such embodiments, the memory material 169 may include a thin tunnel barrier material, and the electrodes 167 of the storage element 166 may be magnetic (e.g., ferromagnetic). As known in the art, MRAM devices may operate on the principle of tunnel magnetoresistance between two magnetic layers (e.g., the electrodes of the storage element 166) separated by a tunnel junction (e.g., the memory material of the storage element 166). An MRAM device may have two stable states: when the magnetic moments of the two magnetic layers are aligned parallel to each other, an MRAM device may be in the LRS, and when aligned antiparallel, an MRAM device may be in the HRS.

Figure 2:
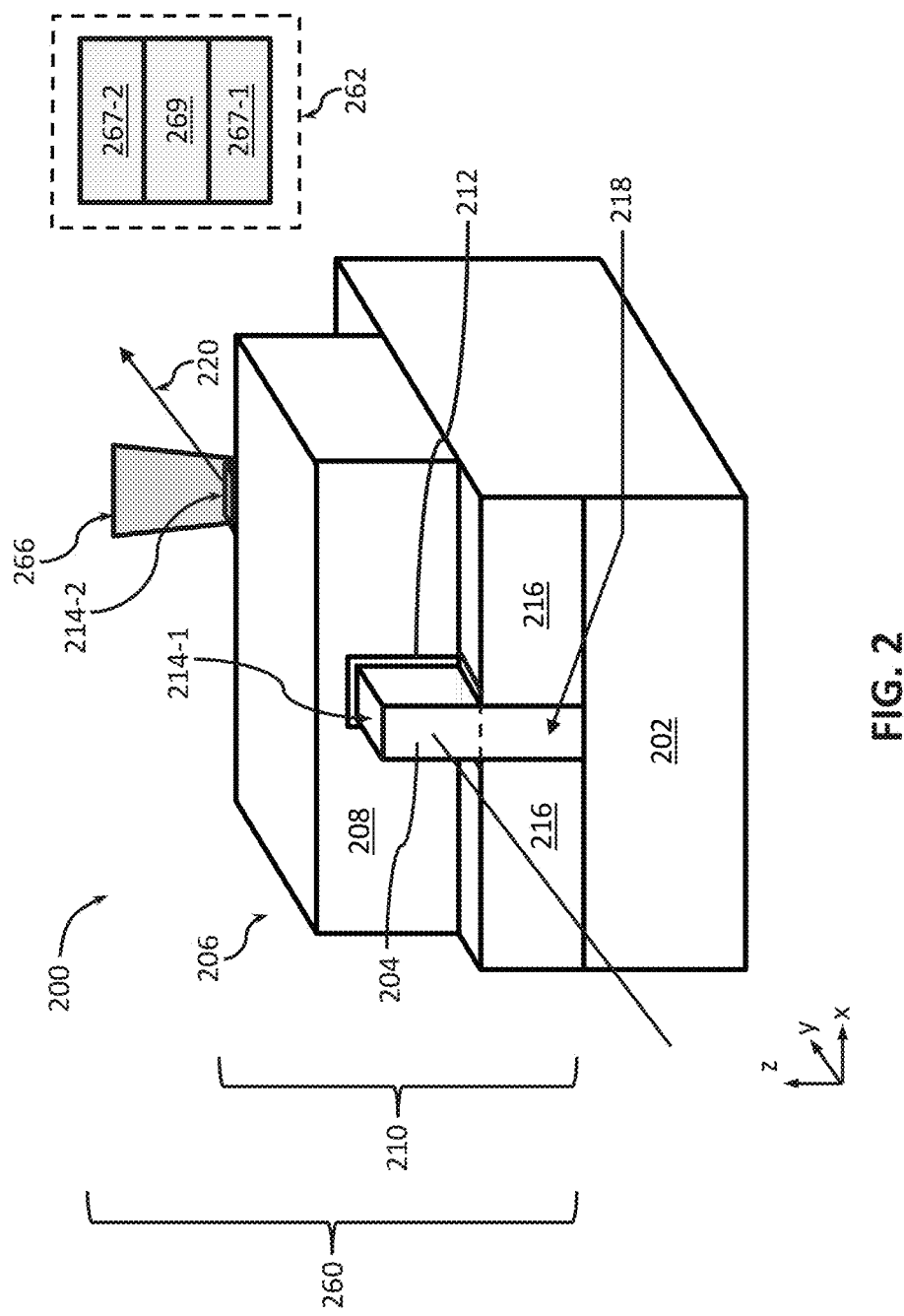
FIG. 2 provides a perspective view of an example IC device implementing a fin-based field-effect transistor (FinFET), in accordance with some embodiments.

FIG. 2 provides a perspective view of an example IC device 200 implementing a FinFET 210, in accordance with some embodiments. The FinFET 210 is another example of a transistor that may be implemented as an angled transistor and that may be included in various IC devices and assemblies described herein.

Turning to the details of FIG. 2, the IC device 200 may include a semiconductor material, which may include one or more semiconductor materials, formed as a fin 204 extending away from a support structure 202. A FinFET 210 may be formed on the basis of the fin 204 by having a gate stack 206 at least partially wrap around a channel region of the fin 204 and by having source and drain regions, shown in FIG. 2 as a first S/D region 214-1 and a second S/D region 214-2, on either side of the gate stack 206. As shown in FIG. 2, the gate stack 206 includes a gate electrode material 208 and a gate insulator 212, each of which wraps entirely or almost entirely around the channel region of the fin 204, although in other embodiments of the IC device 200 the gate insulator 212 may be absent. Descriptions provided above with reference to the support structure 102, the gate stack 106, the gate electrode material 108, the gate insulator 112, and the S/D regions 114 are applicable to, respectively, the support structure 202, the gate stack 206, the gate electrode material 208, the gate insulator 212, and the S/D regions 214, and, therefore, in the interests of brevity, are not repeated. FIG. 2 further illustrates an STI 216, enclosing sidewalls of a subfin portion 218 of the fin 204. The STI 216 may include any of the insulator materials described above, e.g., any suitable ILD materials. Descriptions provided above with reference to the channel material of the transistor 110 are applicable to the semiconductor material of at least a channel region of the fin 204 (e.g., of at least a portion of the fin 204 wrapped by the gate stack 206) and, therefore, in the interests of brevity, are not repeated.

A longitudinal axis 220 of the fin 204 may be along the y-axis of the example coordinate system shown in the present drawings. The FinFET 210 may have a gate length (e.g., a distance between the first and second S/D regions 214-1, 214-2), a dimension measured along the longitudinal axis 220, which may, in some embodiments, be between 2 and 60 nanometers, including all values and ranges therein (e.g., between 5 and 20 nanometers, or between 5 and 30 nanometers). Although the fin 204 is illustrated in FIG. 2 as having a rectangular cross-section in an x-z plane, the fin 204 may instead have a cross-section that is rounded or sloped at the "top" of the fin 204, and the gate stack 206 may conform to this rounded or sloped fin 204. In use, the FinFET 210 may form conducting channels on three "sides" of the fin 204, potentially improving performance relative to single-gate transistors (which may form conducting channels on one "side" of a channel material or substrate) and double-gate transistors (which may form conducting channels on two "sides" of a channel material or substrate). It should be noted that, similar to FIG. 1, FIG. 2 illustrates the x-y-z coordinate system being aligned so that the longitudinal axis 220 is along the y-axis and the gate being aligned along the x-axis only for the ease of explanations of this particular drawing. However, for FinFETs that are implemented as angled transistors as described herein, the longitudinal axis 220 would be in the x-y plane but angled (e.g., at an angle between about 10 and 80 degrees) with respect to the y-axis.

An example of using the FinFET 210 as a part of a memory cell is illustrated in FIG. 2, showing that the IC device 200 may include a memory cell 260 that includes the FinFET 210 and a storage element 266, electrically coupled to the S/D region 214-2. In some embodiments, the storage element 266 may include two electrodes 267-1 and 267-2, separated by a memory material 269. One example of the electrodes 267 and the memory material 269 of the storage element 266 is schematically illustrated within the dashed contour of an inset 262 of FIG. 2, although, in other embodiments, the spatial arrangement of the memory material 269 and the electrodes 267 may be different as long as the memory material 269 is spatially between the electrode 267-1 and the electrode 267-2 (e.g., the memory material 269 does not have to be a planar layer but may be arranged in any kind of a three-dimensional arrangement). Descriptions provided above with reference to the storage element 166, the electrodes 167, and the memory material 169 are applicable to, respectively, the storage element 266, the electrodes 267, and the memory material 269, and, therefore, in the interests of brevity, are not repeated.

Either the nanoribbon 104 or the fin 204 may be an elongated structure based on which any of the angled transistors described herein may be built. In other words, any of the angled transistors with angled routing tracks as described herein may be implemented as, e.g., the transistor 110 or the FinFET 210.

Figures 3A, 3B:
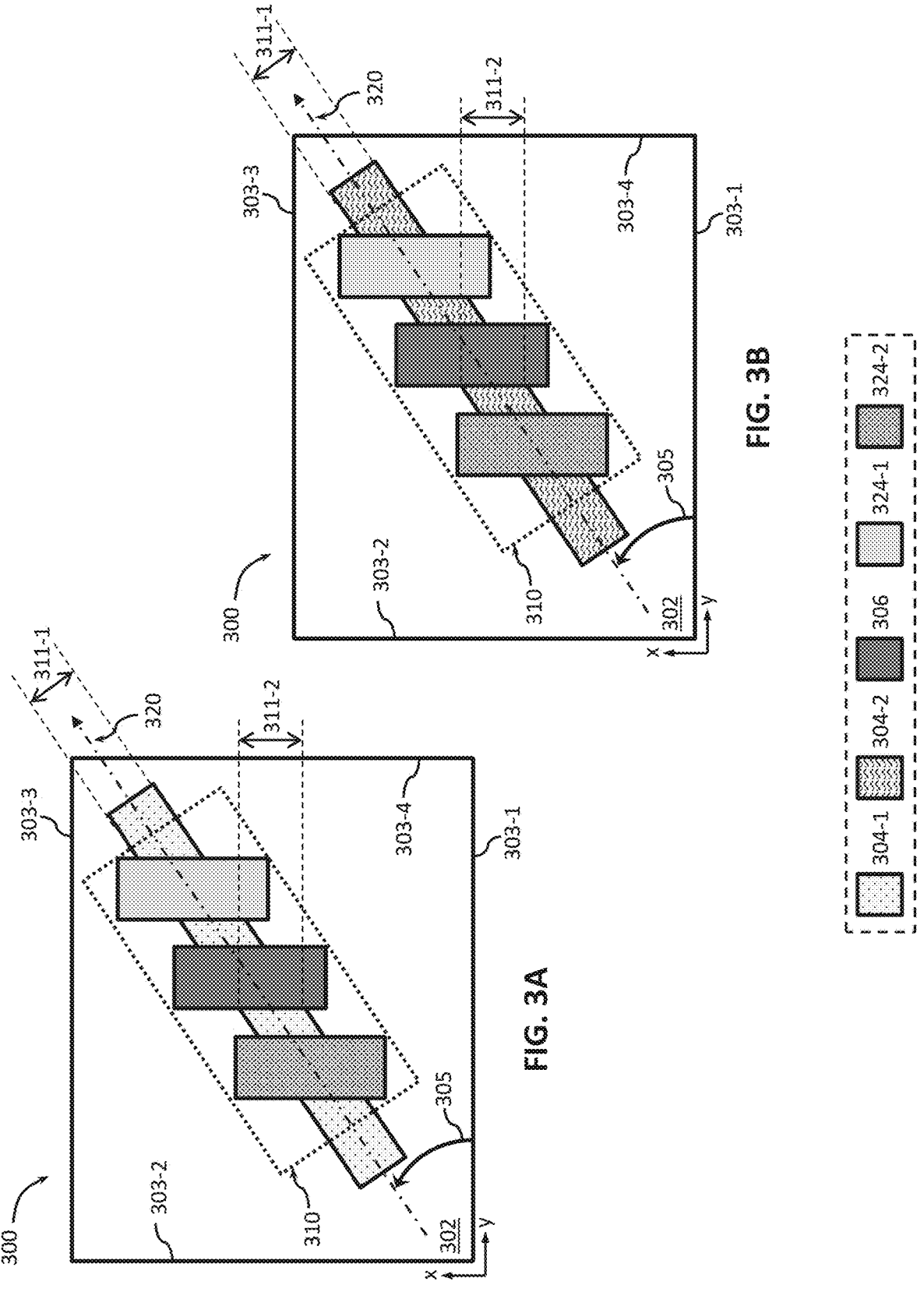
FIGS. 3A-3B provide top-down views of example IC devices with, respectively, N-type and P-type angled transistors that may be implemented with angled routing tracks, in accordance with some embodiments.

FIGS. 3A-3B provide top-down views (e.g., x-y plane views of the example coordinate system shown in the present drawings) of example IC devices 300 with, respectively, N-type and P-type angled transistors that may be implemented with angled routing tracks, in accordance with some embodiments. A number of elements labeled in FIGS. 3A-3B, as well in some of the subsequent drawings (e.g., FIGS. 5A, 6A, 7A, and 8A) with reference numerals that are indicated in these drawings with different patterns in order to not clutter the drawings with too many reference numerals, with a legend showing the correspondence between the reference numerals and patterns being provided within a dashed box at the bottom of these drawings. For example, the legend illustrates that FIGS. 3A-3B and FIGS. 5A, 6A, 7A, and 8A use different patterns to show N-type elongated structures 304-1 (e.g., elongated structures where the semiconductor material of the channel regions of transistors is an N-type semiconductor material), P-type elongated structures 304-2 (e.g., elongated structures where the semiconductor material of the channel regions of transistors is a P-type semiconductor material), gates 306, etc.

The top-down views of the IC devices 300 shown in FIGS. 3A-3B are intended to show relative arrangements of some of the components therein, and the IC devices 300, or portions thereof, may include other components that are not illustrated. For example, although not specifically illustrated in FIGS. 3A-3B, the IC devices 300 may include multiple transistors implemented in, or based on, the elongated structures 304, and/or may include gate spacers as known in the art. In another example, although not specifically illustrated in FIGS. 3A-3B, at least portions of the elongated structures 304 may be surrounded in an insulator material, such as any of the ILD materials described herein.

As shown in FIGS. 3A-3B, the IC device 300 may include a support structure 302, which may include four edges 303, individually shown as an edge 303-1, 303-2, 303-3, and 303-4. The edges 303 may be edges of either the front face of the support structure 302 or the back face of the support structure 302, depending on whether the elongated structures 304 are provided on the front face or the back face of the support structure 302. The support structure 302 may be any of the support structures 102/202, described herein. The support structure 302 is, typically, rectangular and, therefore, adjacent ones of the edges 303 are at 90 degrees with respect to one another. For example, the edges 303-1 and 303-2 are adjacent and at 90 degrees with respect to one another, the edges 303-2 and 303-3 are adjacent and at 90 degrees with respect to one another, and so on.

As shown in FIGS. 3A-3B, one or more elongated structures 304 may be provided over the support structure 302. Any of the elongated structures 304 may be the nanoribbon 104 or the fin 204, described herein. Only one elongated structure 304 is shown in each of FIGS. 3A-3B to illustrate, in FIG. 3A, that the transistor 310 may be an NMOS transistor when the elongated structure 304 is an N-type elongated structure 304-1, and to illustrate, in FIG. 3B, that the transistor 310 may be a PMOS transistor when the elongated structure 304 is a P-type elongated structure 304-2. However, in other embodiments, the IC device 300 may include a plurality of such elongated structures 304 and, as typical for CMOS applications, the IC device 300 may include both NMOS and PMOS transistors 310. Examples of such devices are illustrated with logic circuits of FIGS. 4-8, described below.

The elongated structures 304 shown in FIGS. 3A-3B are "angled" because their longitudinal axes 320 (shown in FIGS. 3A-3B as dash-dotted arrows and being analogous to the longitudinal axes 120, 220, described above) are not at angles of either 0 degrees or 90 degrees with respect to all edges 303 of the support structure 302. As shown in these drawings, the longitudinal axis 320 may be at an angle 305 with respect to the y-axis of the example coordinate system shown, where the angle 305 may be between about 10 and 80 degrees. Thus, the transistors 310 (the approximate outlines of which are shown in FIGS. 3A-3B to be within dotted contours) are angled transistors. The transistors 310 may be implemented as, e.g., the nanoribbon transistors 110 or the FinFETs 210, described above.

FIGS. 3A-3B and the analogous subsequent drawings that show the top-down views of the IC structures with angled transistors illustrate the gates 306 as non-angled gates. For example, in FIGS. 3A-3B and FIGS. 5-8, the gates 306 are at an angle of 90 degrees with respect to each of the edges 303-1 and 303-3 and are at an angle of 0 degrees with respect to each of the edges 303-2 and 303-4. As a result, the gates 306 are angled with respect to the direction of carrier transport of the transistors 310, as defined by the angled longitudinal axes 320. In other embodiments of the IC devices described herein, the gates 306 may be angled with respect to the edges 303, as long as they remain to be angled with respect to the direction of carrier transport of the transistors 310. Any of the gates 306 may be, or include, any of the gate stacks 106/206, described herein.

FIGS. 3A-3B further illustrate that the transistor 310 may include first and second S/D contacts 324-1, 324-2. The first S/D contact 324-1 may be an electrical contact to the first S/D region of the transistor 310 (e.g., the first S/D region 114-1 or 214-1 of, respectively, FIGS. 1 or 2), while the second S/D contact 324-2 may be an electrical contact to the second S/D region of the transistor 310 (e.g., the second S/D region 114-2 or 214-2 of, respectively, FIGS. 1 or 2), and may include any suitable electrically conductive material, as known in the art. In particular, FIGS. 3A-3B illustrate an embodiment where the first and second S/D contacts 324-1, 324-2 may also be non-angled, e.g., may be at the same angle with respect to the edges 303 as the gate 306, although, in other embodiments of the IC devices described herein, the S/D contacts 324 may be angled. Irrespective of whether the S/D contacts 324 are angled, arranging the longitudinal axis 320 of the transistor 310 at an angle with respect to the gate 306 (e.g., arranging the longitudinal axis 320 so that it is not perpendicular to the gate 306) ensures that the cross-section for carrier transport between the first and second S/D regions of the transistor 310 is larger compared to what it would have been for a given width of the elongated structure 304 that is not angled with respect (e.g., perpendicular) to the gate 306, advantageously resulting in an increased drive current for the transistor 310. In particular, if the elongated structure 304 of the transistor 310 was perpendicular to the gate 306, as is done in conventional implementations, then the cross-section for carrier transport between the first and second S/D regions of the transistor 310 would be a cross-section in a plane perpendicular to the x-y plane of the example coordinate system shown in FIGS. 3A-3B with the dimension in the x-y plane being a dimension 311-1 (e.g., the width of the elongated structure 304). However, when the elongated structure 304 and the gate 306 are angled with respect to one another, e.g., as shown in FIGS. 3A-3B, then the cross-section for carrier transport between the first and second S/D regions of the transistor 310 is a cross-section in a plane perpendicular to the x-y plane of the example coordinate system shown in FIGS. 3A-3B with the dimension in the x-y plane being a dimension 311-2 (e.g., the dimension along the x-axis of the example coordinate system shown). The dimension 311-2 is larger than the dimension 311-1 because the dimension 311-2 is the hypotenuse of a triangle in which the dimension 311-1 is a side of the triangle. Because for these two scenarios the dimension along the z-axis is the same (as defined by the height of the elongated structure 304 in the z-axis direction), increasing the dimension in the x-y plane leads to an increased cross-section and, thus, to an increased drive current for a given width of the elongated structure 304.

A plurality of transistors 310 may be formed along any and each of the angled elongated structures 304 of an IC device 300, thus forming angled transistors as described herein. Any of the transistors 310 may be implemented as the transistors 110 and/or the FinFETs 210, but with the gates 306 being angled with respect to the longitudinal axes 320 of the transistors. Any one or more, or any combination of logic, memory, radio frequency (RF), and analog circuits may then be implemented with such transistors 310.

Figure 4B:
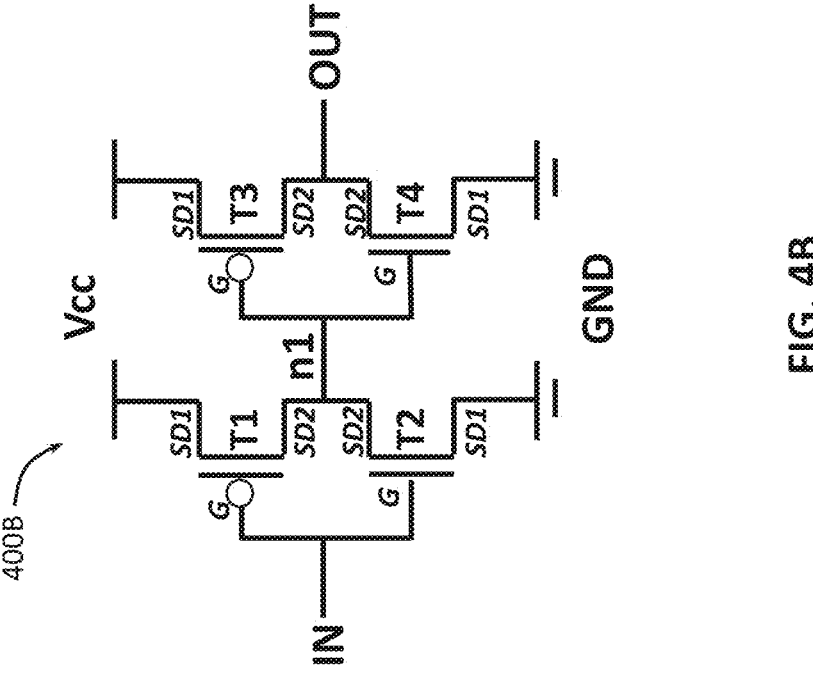
FIGS. 4A-4D provide electric circuit diagrams of logic circuits that may be implemented using angled transistors and angled routing tracks, in accordance with some embodiments.
Figure 6A:
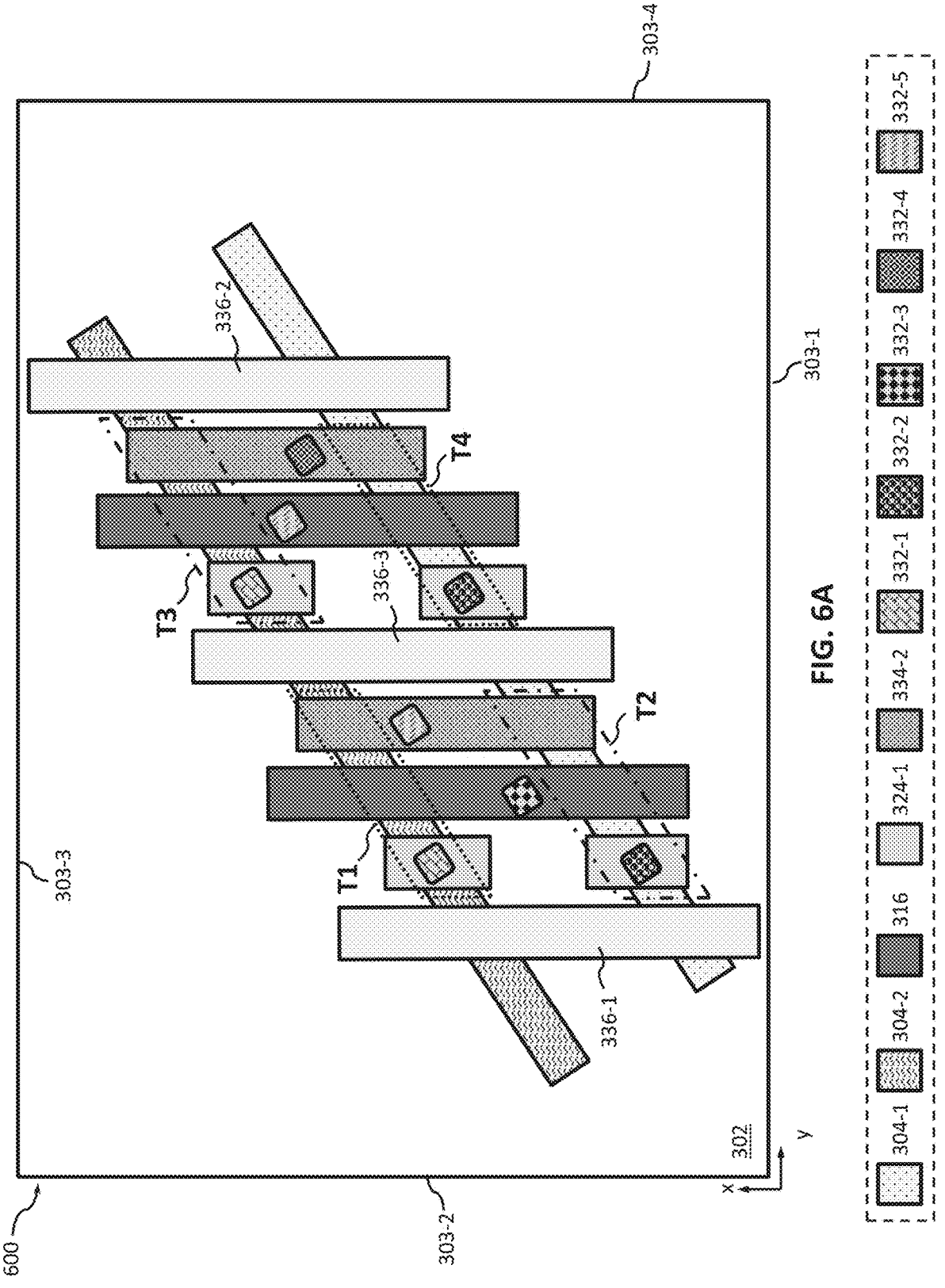
FIGS. 6A-6B provide top-down views of, respectively, a transistor layer and a metallization layer, of an IC device implementing a buffer circuit using angled transistors and angled routing tracks, in accordance with some embodiments.
Figure 6B:
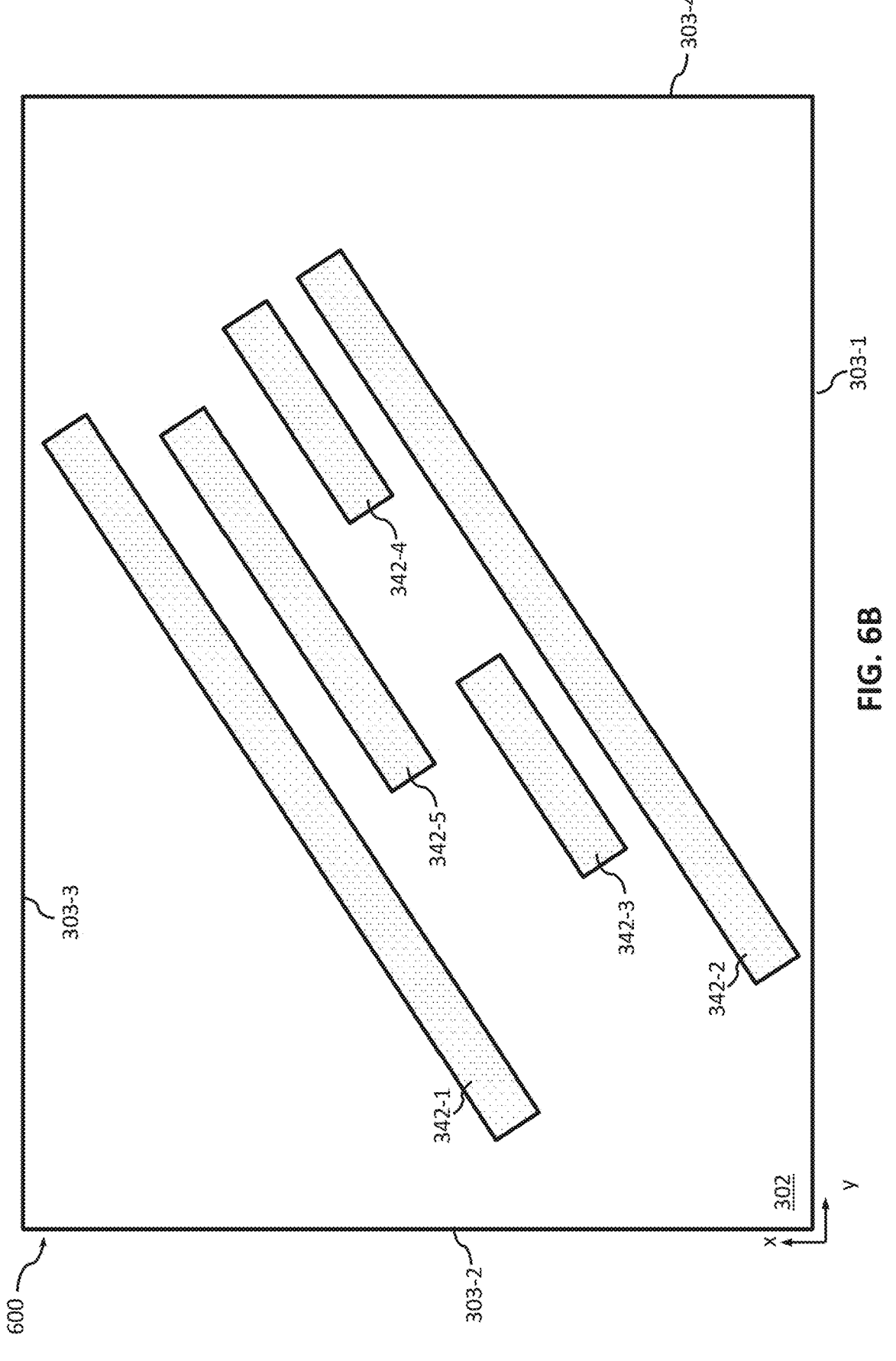
Figure 7A:
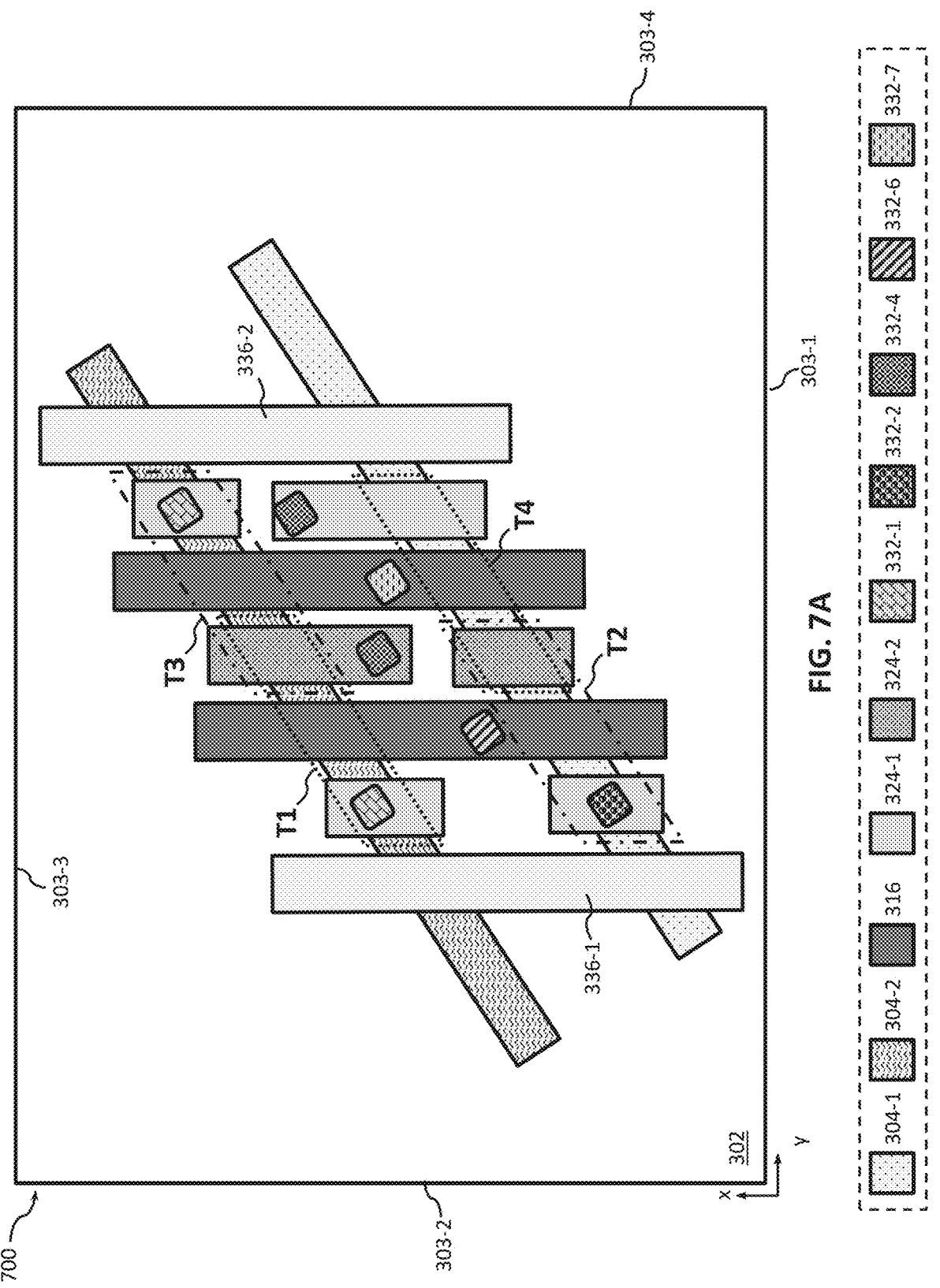
FIGS. 7A-7B provide top-down views of, respectively, a transistor layer and a metallization layer, of an IC device implementing a two-input NAND circuit using angled transistors and angled routing tracks, in accordance with some embodiments.
Figure 7B:
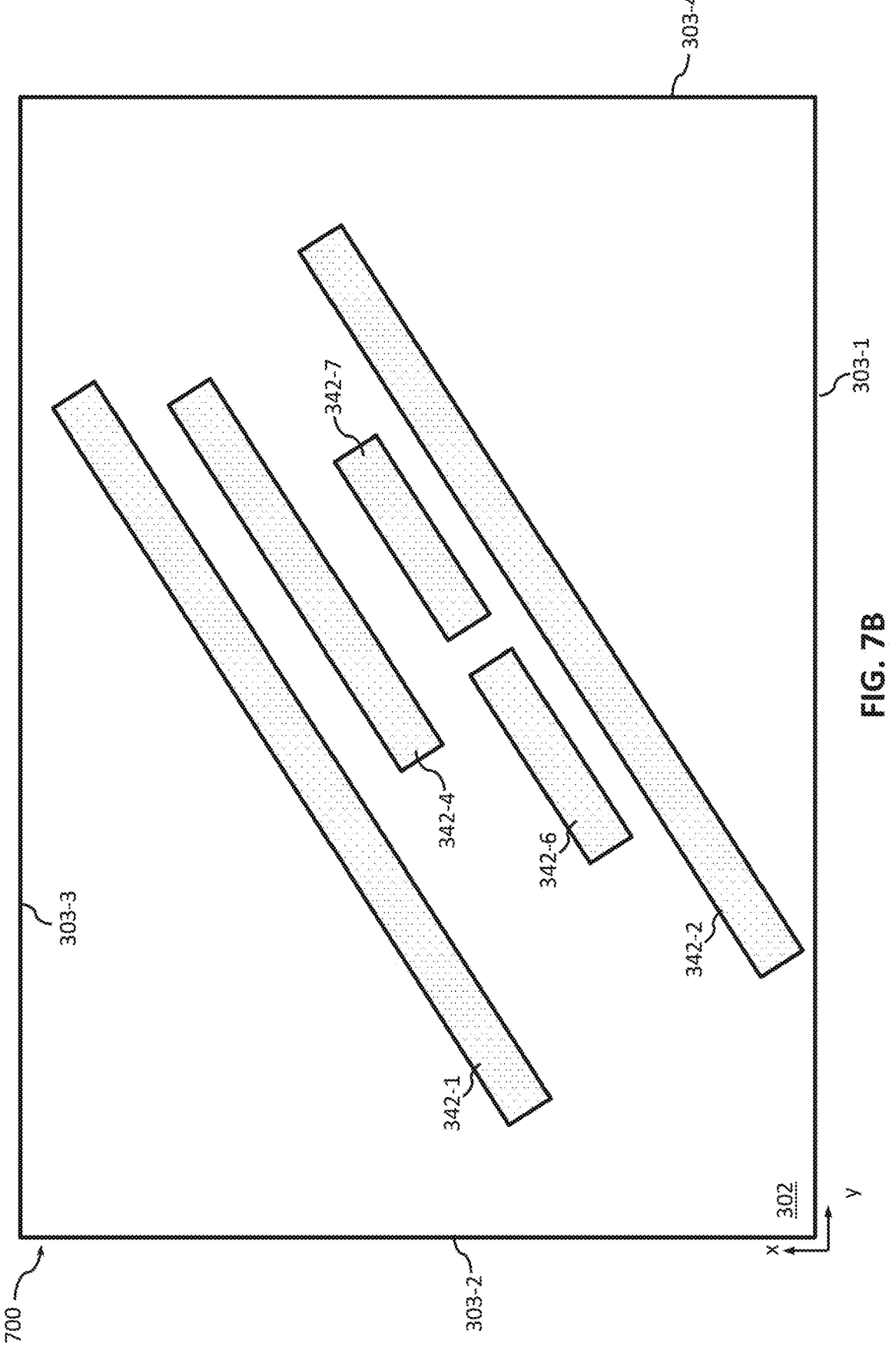
Figure 8A:
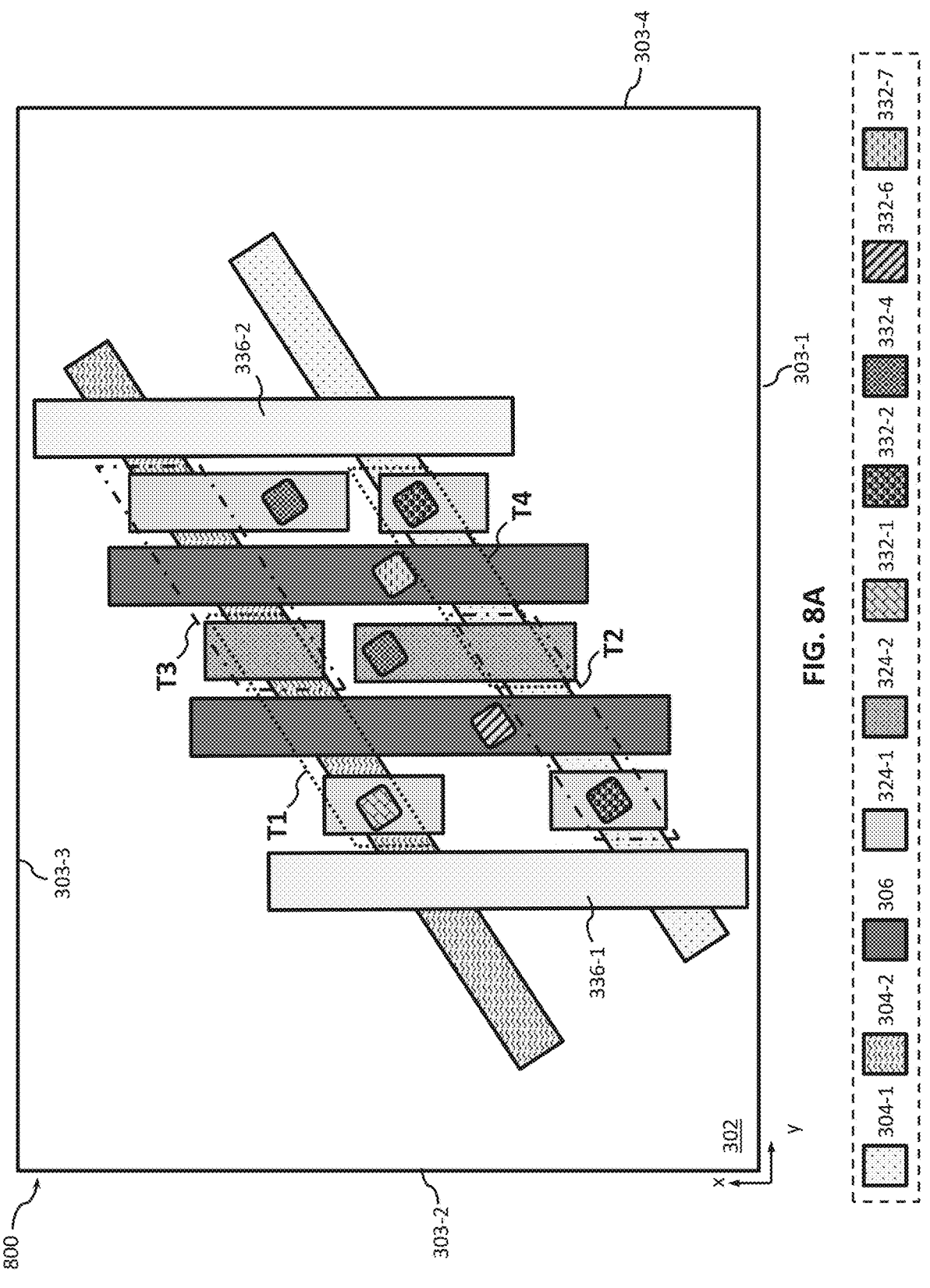
FIGS. 8A-8B provide top-down views of, respectively, a transistor layer and a metallization layer, of an IC device implementing a two-input NOR circuit using angled transistors and angled routing tracks, in accordance with some embodiments.
Figure 8B:
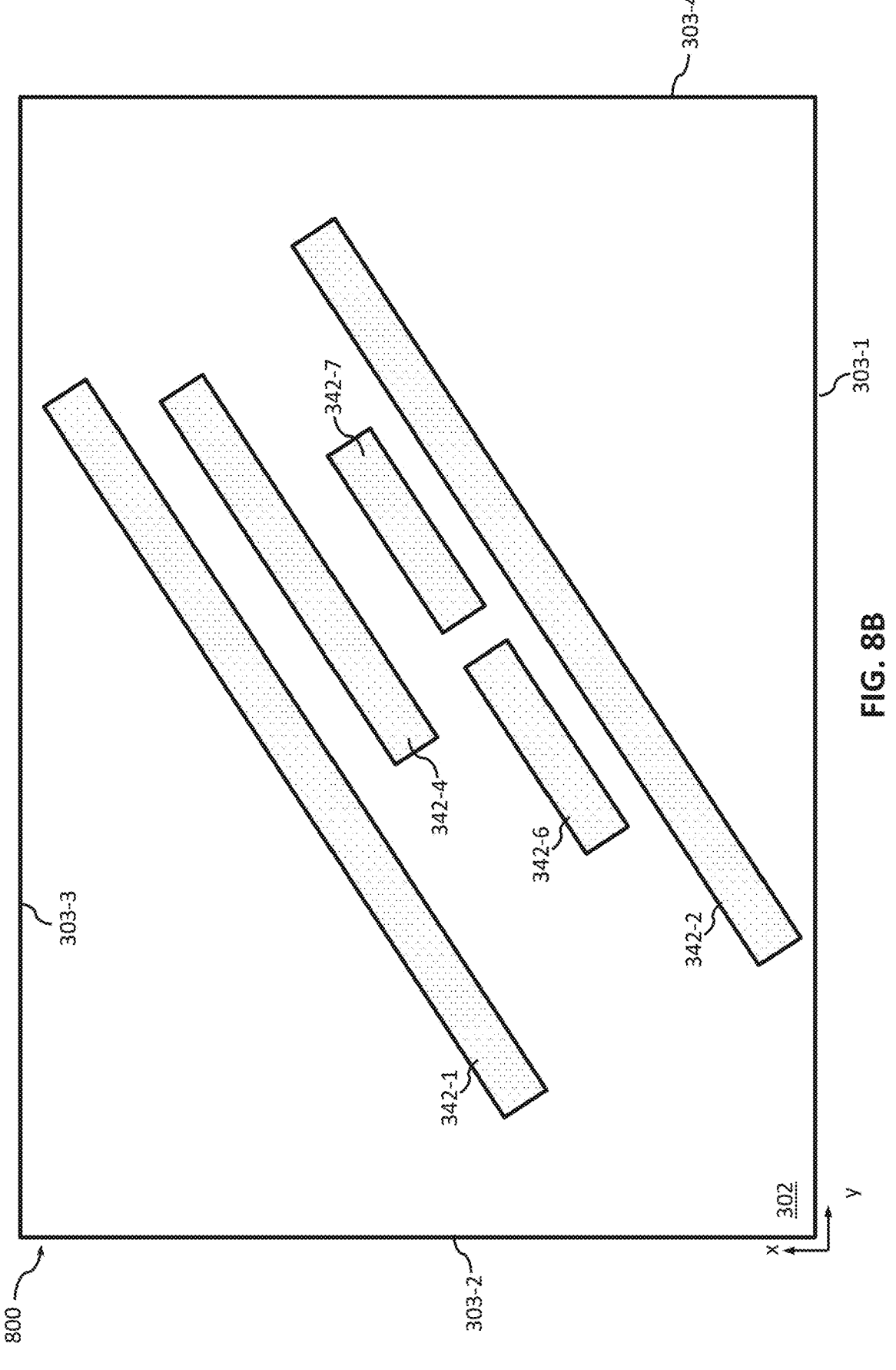

FIGS. 4A-4D provide electric circuit diagrams of logic circuits 400A-400D that may be implemented using angled transistors and angled routing tracks, in accordance with some embodiments. In FIGS. 4A-4D each of the NMOS and PMOS transistors are illustrated using their conventional electric circuit diagram representation with gate, first S/D, and second S/D transistor terminals being labeled as, respectively, G, SD1, and SD2. Each of FIGS. 4A-4D illustrates a logic circuit with four transistors, labeled as transistors T1, T2, T3, and T4, where the transistors T1 and T3 are PMOS transistors and the transistors T2 and T4 are NMOS transistors. Any of the transistors T1-T4 may be an angled transistor as described herein, e.g., may be implemented as the transistor 310. The electric circuit diagrams of FIGS. 4A-4D further label example reference potential terminals GND and Vcc, where GND is a first reference potential terminal, representing an electrical connection to the ground voltage, and where Vcc is a second reference potential terminal, representing an electrical connection to a reference voltage that is higher than the ground voltage. The electric circuit diagrams of FIGS. 4A-4D further label various input and output terminals. Further details of implementing each of the logic circuits 400A-400D with angled transistors and angled routing tracks are shown in FIGS. 5-8, illustrating top-down views of various layers of IC devices implementing different logic circuits 400A-400D and, therefore, some illustrations of FIGS. 5-8 provide labels for the transistors T1-T4 of FIGS. 4A-4D. In particular, FIGS. 5A-5B provide top-down views of, respectively, a transistor layer and a metallization layer, of an IC device 500 implementing a two-legged inverter circuit 400A of FIG. 4A implementing transistors T1-T4 as angled transistors, in accordance with some embodiments; FIGS. 6A-6B provide top-down views of, respectively, a transistor layer and a metallization layer, of an IC device 600 implementing a buffer circuit 400B of FIG. 4B implementing transistors T1-T4 as angled transistors, in accordance with some embodiments; FIGS. 7A-7B provide top-down views of, respectively, a transistor layer and a metallization layer, of an IC device 700 implementing a two-input NAND circuit 400C of FIG. 4C implementing transistors T1-T4 as angled transistors, in accordance with some embodiments; and FIGS. 8A-8B provide top-down views of, respectively, a transistor layer and a metallization layer, of an IC device 800 implementing a two-input NOR circuit 400D of FIG. 4D implementing transistors T1-T4 as angled transistors, in accordance with some embodiments. Therefore, various connections of these example logic circuits are explained below with reference to both the electrical circuit diagrams of FIGS. 4A-4D, and the actual physical layouts of the IC devices of FIGS. 5-8. Logic circuits illustrates in FIGS. 4-8 provide some examples of IC devices with angled transistors and angled routing tracks as described herein, and, in further embodiments, IC devices may implement other logic circuits using angled transistors and angled routing tracks, memory circuits (e.g., with memory cells utilizing angled transistors and angled routing tracks, e.g., memory cells as described with reference to FIGS. 1-2), circuits other than logic circuits (e.g., RF and/or analog circuits), or any combination of various types of circuits.

Figure 4A:
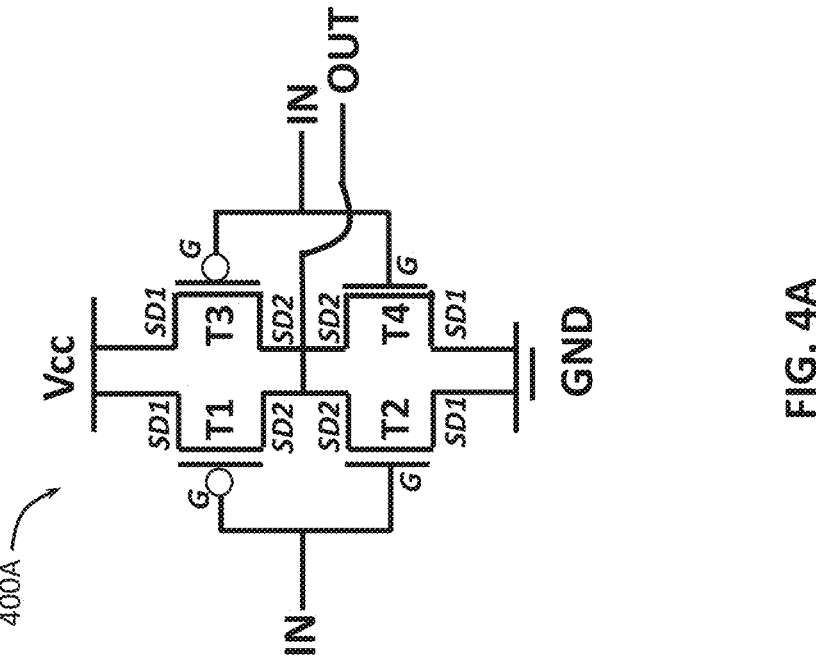
Figure 5A:
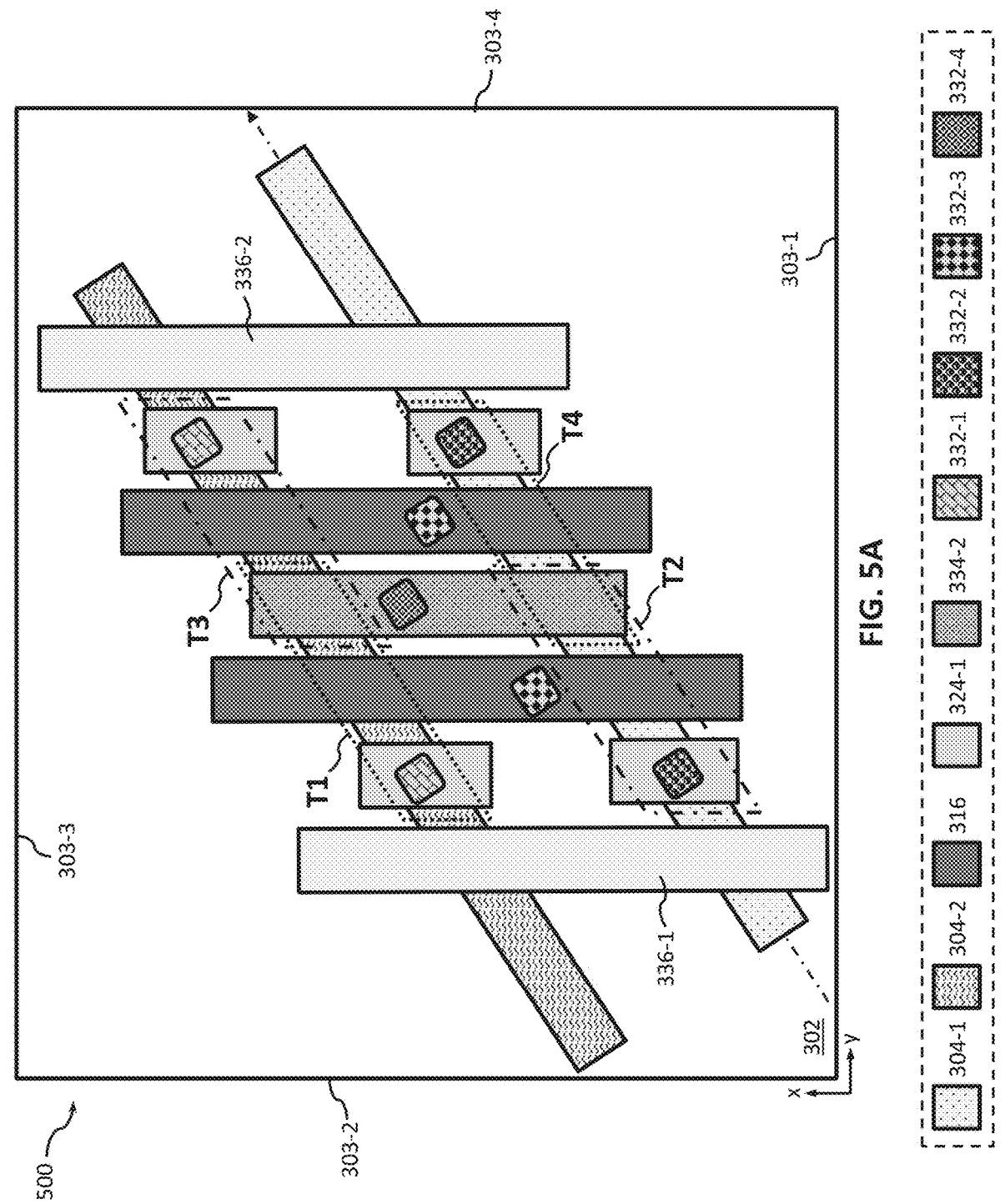
FIGS. 5A-5B provide top-down views of, respectively, a transistor layer and a metallization layer, of an IC device implementing a two-legged inverter circuit using angled transistors and angled routing tracks, in accordance with some embodiments.
Figure 5B:
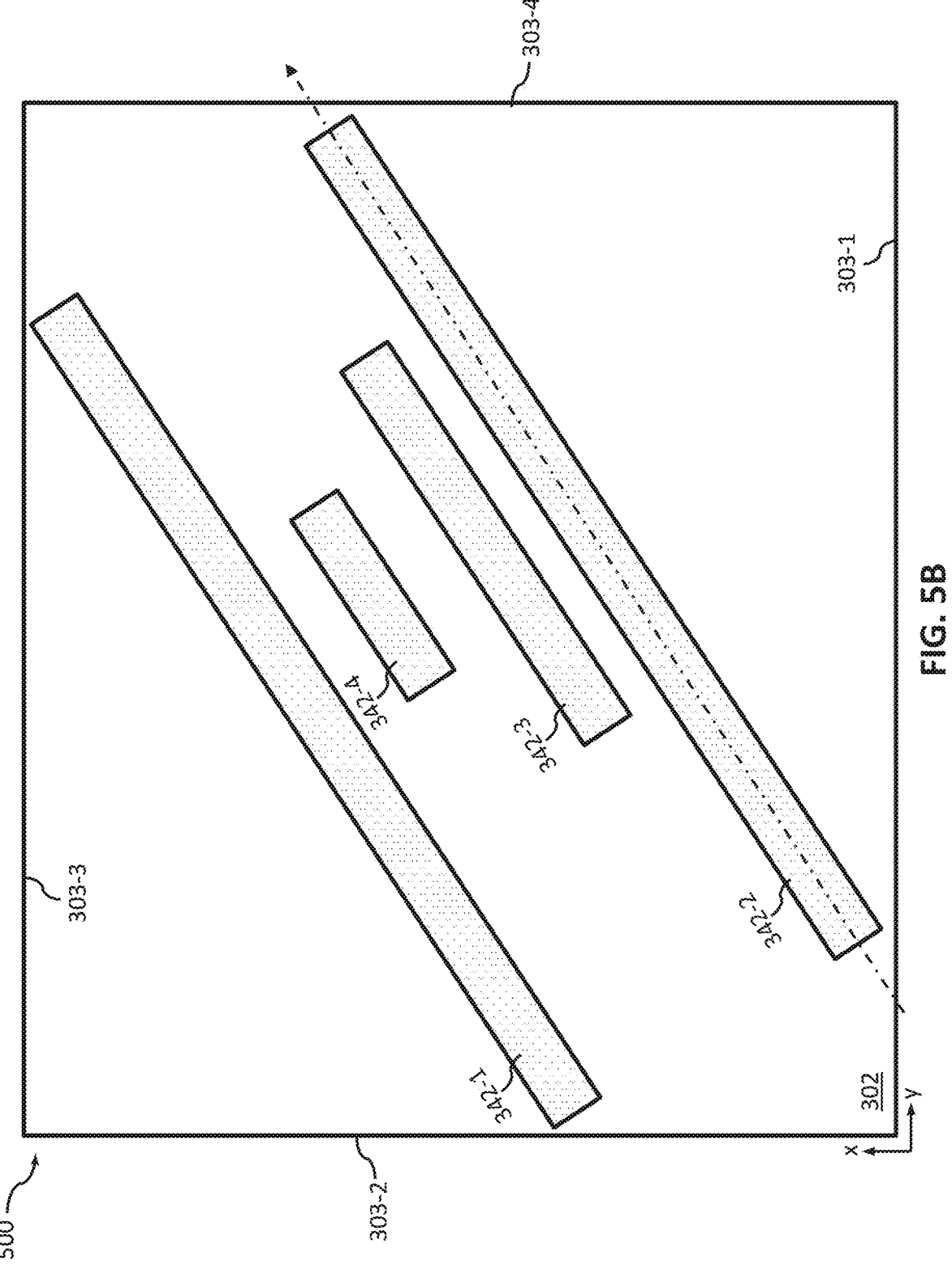

Turning to FIG. 4A and FIGS. 5A-5B, a two-legged inverter circuit 400A may include an input terminal IN coupled to (e.g., directly connected to) the gates G of the transistors T1 and T2 and also coupled to (e.g., directly connected to) the gates G of the transistors T3 and T4. Thus, the gates 306 of the transistors T1 and T2 are coupled to (e.g., directly connected to) one another, as is shown in FIG. 5A with a single first instance of the gate line 316 extending across the N-type elongated structure 304-1 and across the P-type elongated structure 304-2 (e.g., being electrically and/or physically continuous across multiple elongated structures 304) and forming, or being coupled to (e.g., directly connected to) the gate 306 of the transistor T2 provided along the N-type elongated structure 304-1 and the gate 306 of the transistor T1 provided along the P-type elongated structure 304-2. Similarly, the gates 306 of the transistors T3 and T4 are coupled to (e.g., directly connected to) one another, as is shown in FIG. 5A with a single second instance of the gate line 316 extending across the N-type elongated structure 304-1 and across the P-type elongated structure 304-2 (e.g., being electrically and/or physically continuous across multiple elongated structures 304) and forming, or being coupled to (e.g., directly connected to) the gate 306 of the transistor T4 provided along the N-type elongated structure 304-1 and the gate 306 of the transistor T3 provided along the P-type elongated structure 304-2. The gates 306 of the transistors T1-T4 are not specifically shown in FIG. 5A because they are obscured by the gate lines 316. As is shown in FIG. 5A, the elongated structures 304 of the IC device 500 may be angled elongated structures 304, with the angle 305 with respect to and/or with respect to the edges 303 of the support structure 302, and/or with respect to the gate lines 316, being defined as described with reference to FIG. 3. FIG. 5A further illustrates two vias 332-3, one for each of the two gate lines 316 (e.g., coupled to (e.g., directly connected to) respective gate lines 316), in order to couple both of the gate lines 316 and, thus, the gates of each of the transistors T1-T4, to a single input (the input terminal IN) of the two-legged inverter circuit 400A.

The two-legged inverter circuit 400A may further include an output terminal OUT coupled to (e.g., directly connected to) the second S/D terminals SD2 of each of the transistors T1-T4. This is shown in FIG. 5A with a single contact line 334-2 extending across the N-type elongated structure 304-1 and across the P-type elongated structure 304-2 (e.g., being electrically and/or physically continuous across multiple elongated structures 304) and forming, or being coupled to (e.g., directly connected to) the second S/D contact 324-2 of each of the transistors T2 and T4 provided along the N-type elongated structure 304-1 and the second S/D contact 324-2 of each of the transistors T1 and T3 provided along the P-type elongated structure 304-2. The second S/D contact 324-2 of the transistors T1-T4 are not specifically shown in FIG. 5A because they are obscured, or represented/formed, by the contact line 334-2. Thus, in the IC device 500, the transistors T2 and T4 may share their second the second S/D contact 324-2 (e.g., a single contact may serve as the second S/D contact 324-2 for the transistor T2 and as the second S/D contact 324-2 for the transistor T4), and, similarly, the transistors T1 and T3 may share their second the second S/D contact 324-2 (e.g., a single contact may serve as the second S/D contact 324-2 for the transistor T1 and as the second S/D contact 324-2 for the transistor T3). As is shown in FIG. 5A, in some embodiments, the contact line 334-2 may be non-angled contact line 334-2, with the angle with respect to the angled elongated structures 304 and/or with respect to the edges 303 of the support structure 302 being defined as described for the second S/D contacts 324-2 with reference to FIG. 3. In other embodiments of the IC device 500, the contact line 334-2 may be angled. FIG. 5A further illustrates a via 332-4, coupled to (e.g., directly connected to) the contact line 334-2, in order to couple the two gate lines 316 to the output terminal OUT of the two-legged inverter circuit 400A.

The two-legged inverter circuit 400A may further include a Vcc terminal coupled to (e.g., directly connected to) the first S/D terminals SD1 of each of the transistors T1 and T3. This is shown in FIG. 5A with the individual first S/D contacts 324-1 of the transistors T1 and T3 being coupled to (e.g., directly connected to) respective vias 332-1, where the vias 332-1 provide electrical coupling (e.g., direct electrical connection) to voltage Vcc. Similarly, the two-legged inverter circuit 400A may further include a GND terminal coupled to (e.g., directly connected to) the first S/D terminals SD1 of each of the transistors T2 and T4. This is shown in FIG. 5A with the individual first S/D contacts 324-1 of the transistors T2 and T4 being coupled to (e.g., directly connected to) respective vias 332-2, where the vias 332-2 provide electrical coupling (e.g., direct electrical connection) to the ground voltage. As is shown in FIG. 5A, in some embodiments, all of the first S/D contacts 324-1 may be non-angled first S/D contacts 324-1, with the angle with respect to the angled elongated structures 304 and/or with respect to the edges 303 of the support structure 302 being defined as described for the first S/D contacts 324-1 with reference to FIG. 3. In other embodiments of the IC device 500, any of the first S/D contacts 324-1 may be angled.

The two-legged inverter circuit 400A may be made particularly compact if the two NMOS transistors are provided along a single N-type elongated structure 304-1, as is shown in FIG. 5A with the transistors T2 and T4 provided along the N-type elongated structure 304-1, and if the two PMOS transistors are provided along a single P-type elongated structure 304-2, as is shown in FIG. 5A with the transistors T1 and T3 provided along the P-type elongated structure 304-2. As further shown in FIG. 5A, in some embodiments, isolation structures 336-1 and 336-2 may be provided to ensure electrical isolation of the two-legged inverter circuit 400A from other transistors and other components that may be coupled to further portions of the elongated structures 304 (such other transistors and components not specifically shown in FIG. 5A). The isolation structures 336 may include any of the insulator materials described herein. As is shown in FIG. 5A, in some embodiments, the isolation structures 336 may be non-angled isolation structures 336, with the angle with respect to the angled elongated structures 304 and/or with respect to the edges 303 of the support structure 302 substantially matching of the gates 306 as described above. In other embodiments of the IC device 500, any of the isolation structures 336 may be angled.

While FIG. 5A provides an illustration of a transistor layer of the IC device 500, FIG. 5B illustrates a metallization layer of the IC device 500. As is shown in FIG. 5B, an example metallization layer of the IC device 500 may include routing tracks 342-1 through 342-4, where the routing track 342-1 may be coupled to (e.g., directly connected to) the vias 332-1 for providing electrical connectivity to the voltage Vcc for the IC device 500, the routing track 342-2 may be coupled to (e.g., directly connected to) the vias 332-2 for providing electrical connectivity to the ground voltage GND for the IC device 500, the routing track 342-3 may be coupled to (e.g., directly connected to) the vias 332-3 for providing electrical connectivity to the input terminal IN of the IC device 500, and the routing track 342-4 may be coupled to (e.g., directly connected to) the via 332-4 for providing electrical connectivity to the output terminal OUT of the IC device 500. FIG. 5B illustrates that the routing tracks 342 of the IC device 500 may be angled with respect to edges 303, e.g., be aligned with the angle 305 of the angled elongated structures 304. Even though FIGS. 5B illustrates all of the routing tracks 342-1 through 342-4 being provided within a single metallization layer (e.g., a metal layer M0), in other embodiments of the IC device 500, any of the routing tracks 342-1 through 342-4 may be provided in any of the metallization layers of the IC device 500.

Turning to FIG. 4B and FIGS. 6A-6B, a buffer circuit 400B may include an input terminal IN coupled to (e.g., directly connected to) the gates G of the transistors T1 and T2. Thus, the gates 306 of the transistors T1 and T2 are coupled to (e.g., directly connected to) one another, as is shown in FIG. 6A with a single first instance of the gate line 316 extending across the N-type elongated structure 304-1 and across the P-type elongated structure 304-2 (e.g., being electrically and/or physically continuous across multiple elongated structures 304) and forming, or being coupled to (e.g., directly connected to) the gate 306 of the transistor T2 provided along the N-type elongated structure 304-1 and the gate 306 of the transistor T1 provided along the P-type elongated structure 304-2. Similarly, the gates 306 of the transistors T3 and T4 of the buffer circuit 400B are coupled to (e.g., directly connected to) one another, as is shown in FIG. 6A with a single second instance of the gate line 316 extending across the N-type elongated structure 304-1 and across the P-type elongated structure 304-2 (e.g., being electrically and/or physically continuous across multiple elongated structures 304) and forming, or being coupled to (e.g., directly connected to) the gate 306 of the transistor T4 provided along the N-type elongated structure 304-1 and the gate 306 of the transistor T3 provided along the P-type elongated structure 304-2. Similar to the two-legged inverter circuit 400A shown in FIG. 5A, the gates 306 of the transistors T1-T4 are not specifically shown in FIG. 6A because they are obscured by the gate lines 316. Also similar to FIG. 5A, the elongated structures 304 of the IC device 600 may be angled elongated structures 304, with the angle with respect to and/or with respect to the edges 303 of the support structure 302, and/or with respect to the gate lines 316, being defined as described with reference to FIG. 3. But in contrast to FIG. 5A, the two gate lines 316 of the buffer circuit 400B shown in FIG. 6A the two gate lines 316 are coupled to different signals, as described below.

The buffer circuit 400B may further include an output terminal OUT coupled to (e.g., directly connected to) the second S/D terminals SD2 of each of the transistors T3 and T4. This is shown in FIG. 6A with a single first instance of the contact line 334-2 extending across the N-type elongated structure 304-1 and across the P-type elongated structure 304-2 (e.g., being electrically and/or physically continuous across multiple elongated structures 304) and forming, or being coupled to (e.g., directly connected to) the second S/D contact 324-2 of the transistor T4 provided along the N-type elongated structure 304-1 and the second S/D contact 324-2 of the transistor T3 provided along the P-type elongated structure 304-2. The second S/D terminals SD2 of each of the transistors T1 and T2 are also coupled to one another in the buffer circuit 400B, similar to the transistors T3 and T4. This is shown in FIG. 6A with a single second instance of the contact line 334-2 extending across the N-type elongated structure 304-1 and across the P-type elongated structure 304-2 (e.g., being electrically and/or physically continuous across multiple elongated structures 304) and forming, or being coupled to (e.g., directly connected to) the second S/D contact 324-2 of the transistor T2 provided along the N-type elongated structure 304-1 and the second S/D contact 324-2 of the transistor T1 provided along the P-type elongated structure 304-2. The second S/D contact 324-2 of the transistors T1-T4 are not specifically shown in FIG. 6A because they are obscured, or represented/formed, by the respective ones of the first and second contact lines 334-2. As is shown in FIG. 6A, in some embodiments, the first and second contact lines 334-2 may be non-angled contact lines 334-2, with the angle with respect to the elongated structures 304 and/or with respect to the edges 303 of the support structure 302 being defined as described for the second S/D contacts 324-2 with reference to FIG. 3. In other embodiments of the IC device 600, any of the first and second contact lines 334-2 may be angled. FIG. 6A further illustrates a via 332-4, coupled to (e.g., directly connected to) the first instance of the contact line 334-2 (e.g., the contact line 334-2 that is shared between the transistors T3 and T4), in order to couple the second S/D contacts 324-2 of the transistors T3 and T4 to the output terminal OUT of the buffer circuit 400B.

FIG. 6A also illustrates a first instance of a via 332-5 coupled to (e.g., directly connected to) the second instance of the contact line 334-2 (e.g., the contact line 334-2 that is shared between the transistors T1 and T2), and a second instance of a via 332-5 coupled to (e.g., directly connected to) the second instance of the gate line 316 (e.g., the gate line 316 that is shared between the transistors T3 and T4). The first instance of the via 332-5 couples the second S/D contacts 324-2 of the transistors T1 and T2 to an intermediate node n1 of the buffer circuit 400B, while the second instance of the via 332-5 couples the gates 306 of the transistors T3 and T4 to the intermediate node n1. In this manner, the second S/D contacts 324-2 of the transistors T1 and T2 and the gates 306 of the transistors T3 and T4 may be coupled to each other via the intermediate node n1, as shown in FIG. 4B.

Similar to FIG. 5A, the buffer circuit 400B may further include a Vcc terminal coupled to (e.g., directly connected to) the first S/D terminals SD1 of each of the transistors T1 and T3. This is shown in FIG. 6A with the individual first S/D contacts 324-1 of the transistors T1 and T3 being coupled to (e.g., directly connected to) respective vias 332-1, where the vias 332-1 provide electrical coupling (e.g., direct electrical connection) to voltage Vcc. Also similar to FIG. 5A, the buffer circuit 400B may further include a GND terminal coupled to (e.g., directly connected to) the first S/D terminals SD1 of each of the transistors T2 and T4. This is shown in FIG. 6A with the individual first S/D contacts 324-1 of the transistors T2 and T4 being coupled to (e.g., directly connected to) respective vias 332-2, where the vias 332-2 provide electrical coupling (e.g., direct electrical connection) to the ground voltage. As is shown in FIG. 6A, in some embodiments, all of the first S/D contacts 324-1 may be non-angled first S/D contacts 324-1, with the angle with respect to the elongated structures 304 and/or with respect to the edges 303 of the support structure 302 being defined as described for the first S/D contacts 324-1 with reference to FIG. 3. In other embodiments of the IC device 600, any of the first S/D contacts 324-1 may be angled.

Similar to FIG. 5A, the buffer circuit 400B may be made particularly compact if the two NMOS transistors are provided along a single N-type elongated structure 304-1, as is shown in FIG. 6A with the transistors T2 and T4 provided along the N-type elongated structure 304-1, and if the two PMOS transistors are provided along a single P-type elongated structure 304-2, as is shown in FIG. 6A with the transistors T1 and T3 provided along the P-type elongated structure 304-2. Also similar to FIG. 5A, in some embodiments of the buffer circuit 400B of FIG. 6A, the isolation structures 336-1 and 336-2 may be provided to ensure electrical isolation of the buffer circuit 400B from other transistors and other components that may be coupled to further portions of the elongated structures 304 (such other transistors and components not specifically shown in FIG. 6A). Furthermore, another similar isolation structure 336-3 may be provided as shown in FIG. 6A to provide electrical isolation between the second S/D contact 324-2 of the transistor T1 and the first S/D contact 324-1 of the transistor T3 in the P-type elongated structure 304-2 and to, similarly, provide electrical isolation between the second S/D contact 324-2 of the transistor T2 and the first S/D contact 324-1 of the transistor T4 in the N-type elongated structure 304-1. As is shown in FIG. 6A, in some embodiments, the isolation structures 336 may be non-angled isolation structures 336, with the angle with respect to the elongated structures 304 and/or with respect to the edges 303 of the support structure 302 substantially matching of the gates 306 as described above. In other embodiments of the IC device 600, any of the isolation structures 336 may be angled.

While FIG. 6A provides an illustration of a transistor layer of the IC device 600, FIG. 6B illustrates a metallization layer of the IC device 600. As is shown in FIG. 6B, an example metallization layer of the IC device 600 may include routing tracks 342-1 through 342-4, where the routing track 342-1 may be coupled to (e.g., directly connected to) the vias 332-1 for providing electrical connectivity to the voltage Vcc for the IC device 600, the routing track 342-2 may be coupled to (e.g., directly connected to) the vias 332-2 for providing electrical connectivity to the ground voltage GND for the IC device 600, the routing track 342-3 may be coupled to (e.g., directly connected to) the vias 332-3 for providing electrical connectivity to the input terminal IN of the IC device 600, the routing track 342-4 may be coupled to (e.g., directly connected to) the via 332-4 for providing electrical connectivity to the output terminal OUT of the IC device 600, and the routing track 342-5 may be coupled to (e.g., directly connected to) the vias 332-5 for providing electrical connectivity between the second S/D contacts 324-2 of the transistors T1, T2 and the gates 306 of the transistors T3, T4 (e.g., the routing track 342-5 may represent the intermediate node n1 of the buffer circuit 400B). FIG. 6B illustrates that the routing tracks 342 of the IC device 600 may be angled with respect to edges 303, e.g., be aligned with the angle 305 of the angled elongated structures 304. Even though FIGS. 6B illustrates all of the routing tracks 342-1 through 342-5 being provided within a single metallization layer (e.g., a metal layer MO), in other embodiments of the IC device 600, any of the routing tracks 342-1 through 342-5 may be provided in any of the metallization layers of the IC device 600.

Figure 4C:
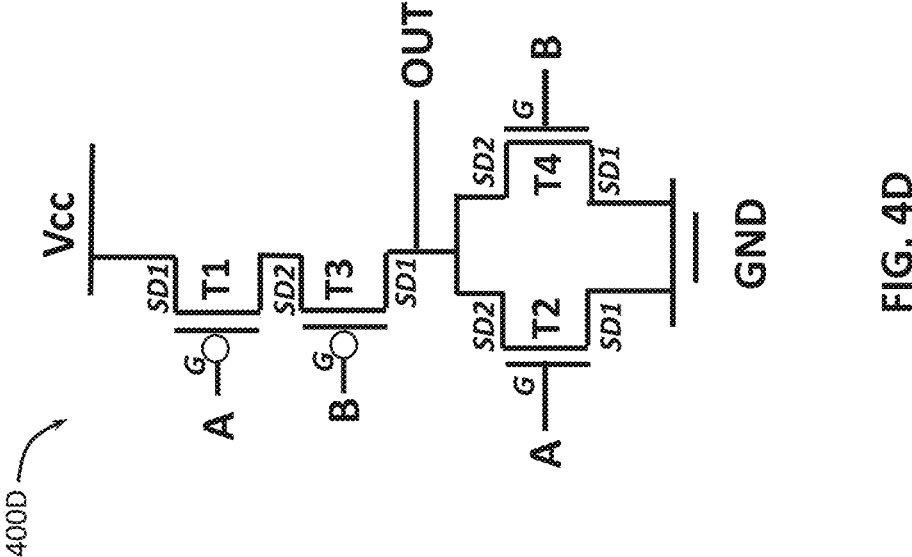
Figure 4D:
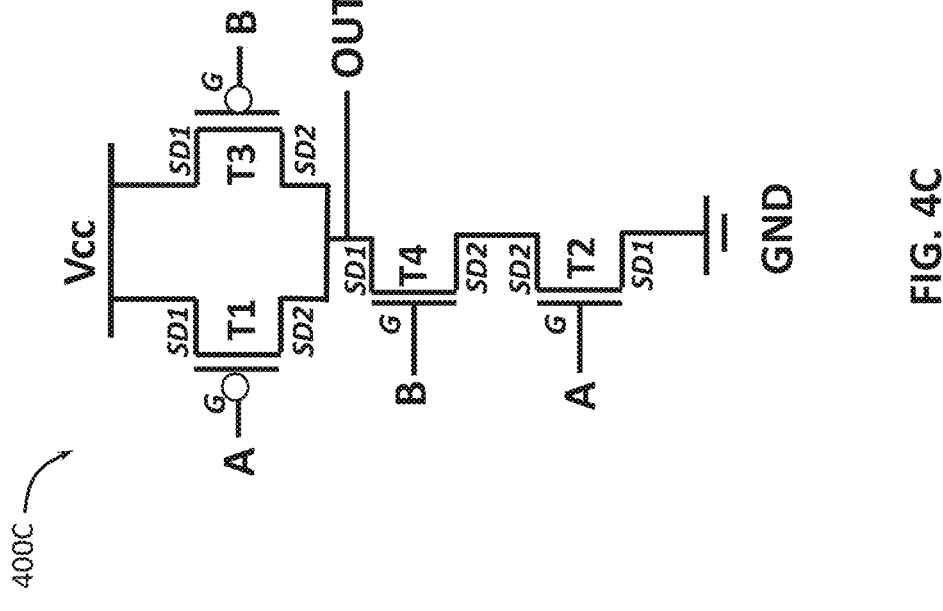

While the two-legged inverter circuit 400A and the buffer circuit 400B provide examples of logic circuits with a single input, the logic circuits shown in FIGS. 4C and 4D are examples of two-input logic circuits, where one input terminal is designated as a first input terminal A and another input terminal is designated as a second input terminal B.

Turning to FIG. 4C and FIGS. 7A-7B, a two-input NAND circuit 400C may include a first input terminal A coupled to (e.g., directly connected to) the gates G of the transistors T1 and T2, and further include a second input terminal B, different from the first input terminal A, coupled to (e.g., directly connected to) the gates G of the transistors T3 and T4. Thus, the gates 306 of the transistors T1 and T2 are coupled to (e.g., directly connected to) one another, as is shown in FIG. 7A with a single first instance of the gate line 316 extending across the N-type elongated structure 304-1 and across the P-type elongated structure 304-2 (e.g., being electrically and/or physically continuous across multiple elongated structures 304) and forming, or being coupled to (e.g., directly connected to) the gate 306 of the transistor T2 provided along the N-type elongated structure 304-1 and the gate 306 of the transistor T1 provided along the P-type elongated structure 304-2. Similarly, the gates 306 of the transistors T3 and T4 are coupled to (e.g., directly connected to) one another, as is shown in FIG. 7A with a single second instance of the gate line 316 extending across the N-type elongated structure 304-1 and across the P-type elongated structure 304-2 (e.g., being electrically and/or physically continuous across multiple elongated structures 304) and forming, or being coupled to (e.g., directly connected to) the gate 306 of the transistor T4 provided along the N-type elongated structure 304-1 and the gate 306 of the transistor T3 provided along the P-type elongated structure 304-2. The gates 306 of the transistors T1-T4 are not specifically shown in FIG. 7A because they are obscured by the gate lines 316. As is shown in FIG. 7A, the elongated structures 304 of the IC device 700 may be angled elongated structures 304, with the angle with respect to and/or with respect to the edges 303 of the support structure 302, and/or with respect to the gate lines 316, being defined as described with reference to FIG. 3. FIG. 7A further illustrates a via 332-6 and a via 332-7. The via 332-6 is coupled to (e.g., directly connected to) the gate line 316 extending between the transistors T1 and T2, in order to couple the gates 306 of the transistors T1 and T2 to the first input terminal A of the two-input NAND circuit 400C, while the via 332-7 is coupled to (e.g., directly connected to) the gate line 316 extending between the transistors T3 and T4, in order to couple the gates 306 of the transistors T3 and T4 to the second input terminal B of the two-input NAND circuit 400C.

The two-input NAND circuit 400C may further include an output terminal OUT coupled to (e.g., directly connected to) the second S/D terminals SD2 of each of the transistors T1 and T3 as well as to the first S/D terminal SD1 of the transistor T4. This is shown in FIG. 7A with the second S/D contact 324-2 of the transistors T1 and T3 being a single contact shared between these transistors and being coupled to (e.g., directly connected to) a first via 332-4 that connects the shared second S/D contact 324-2 of the transistors T1 and T3 to the output terminal OUT. This is further shown in FIG. 7A with the first S/D contact 324-1 of the transistor T4 being coupled to (e.g., directly connected to) a second via 332-4 that connects the first S/D contact 324-1 of the transistor T4 to the output terminal OUT.

In the two-input NAND circuit 400C, the second S/D terminals SD2 of the transistors T2 and T4 are coupled together. This is illustrated in FIG. 7A by showing the second S/D contact 324-2 of the transistors T2 and T4 as a single second S/D contact shared between these transistors.

The two-input NAND circuit 400C may further include a Vcc terminal coupled to (e.g., directly connected to) the first S/D terminals SD1 of each of the transistors T1 and T3. This is shown in FIG. 7A with the individual first S/D contacts 324-1 of the transistors T1 and T3 being coupled to (e.g., directly connected to) respective vias 332-1, where the vias 332-1 provide electrical coupling (e.g., direct electrical connection) to voltage Vcc. Similarly, the two-input NAND circuit 400C may further include a GND terminal coupled to (e.g., directly connected to) the first S/D terminal SD1 of the transistor T2. This is shown in FIG. 7A with the first S/D contact 324-1 of the transistor T2 being coupled to (e.g., directly connected to) the via 332-2, where the via 332-2 provides electrical coupling (e.g., direct electrical connection) to the ground voltage.

As is shown in FIG. 7A, in some embodiments, all of the first S/D contacts 324-1 may be non-angled first S/D contacts 324-1 and all of the second S/D contacts 324-2 may be non-angled second S/D contacts 324-2, with the angle with respect to the elongated structures 304 and/or with respect to the edges 303 of the support structure 302 being defined as described for the first and second S/D contacts 324-1, 324-2 with reference to FIG. 3. In other embodiments of the IC device 700, any of the first or second S/D contacts 324-1, 324-2 may be angled.

The two-input NAND circuit 400C may be made particularly compact if the two NMOS transistors are provided along a single N-type elongated structure 304-1, as is shown in FIG. 7A with the transistors T2 and T4 provided along the N-type elongated structure 304-1, and if the two PMOS transistors are provided along a single P-type elongated structure 304-2, as is shown in FIG. 7A with the transistors T1 and T3 provided along the P-type elongated structure 304-2. As further shown in FIG. 7A, in some embodiments, isolation structures 336-1 and 336-2 may be provided to ensure electrical isolation of the two-input NAND circuit 400C from other transistors and other components that may be coupled to further portions of the elongated structures 304 (such other transistors and components not specifically shown in FIG. 7A). As is shown in FIG. 7A, in some embodiments, the isolation structures 336 may be non-angled isolation structures 336, with the angle with respect to the elongated structures 304 and/or with respect to the edges 303 of the support structure 302 substantially matching of the gates 306 as described above. In other embodiments of the IC device 700, any of the isolation structures 336 may be angled.

While FIG. 7A provides an illustration of a transistor layer of the IC device 700, FIG. 7B illustrates a metallization layer of the IC device 700. As is shown in FIG. 7B, an example metallization layer of the IC device 700 may include routing tracks 342-1, 342-2, 342-4, 342-6, and 342-7, where the routing track 342-1 may be coupled to (e.g., directly connected to) the two vias 332-1 for providing electrical connectivity to the voltage Vcc for the IC device 700, the routing track 342-2 may be coupled to (e.g., directly connected to) the via 332-2 for providing electrical connectivity to the ground voltage GND for the IC device 700, the routing track 342-4 may be coupled to (e.g., directly connected to) the two vias 332-4 for providing electrical connectivity to the output terminal OUT of the IC device 700, the routing track 342-6 may be coupled to (e.g., directly connected to) the via 332-6 for providing electrical connectivity to the first input terminal A of the IC device 700, and the routing track 342-7 may be coupled to (e.g., directly connected to) the via 332-7 for providing electrical connectivity to the second input terminal B of the IC device 700. FIG. 7B illustrates that the routing tracks 342 of the IC device 700 may be angled with respect to edges 303, e.g., be aligned with the angle 305 of the angled elongated structures 304. Even though FIGS. 7B illustrates all of the routing tracks 342-1, 342-2, 342-4, 342-6, and 342-7 being provided within a single metallization layer (e.g., a metal layer M0), in other embodiments of the IC device 700, any of the routing tracks 342-1, 342-2, 342-4, 342-6, and 342-7 may be provided in any of the metallization layers of the IC device 700.

As the last example of a logic circuit in which angled transistors with angled routing tracks may be used, turning to FIG. 4D and FIGS. 8A-8B, a two-input NOR circuit 400D may include a first input terminal A coupled to (e.g., directly connected to) the gates G of the transistors T1 and T2, and further include a second input terminal B, different from the first input terminal A, coupled to (e.g., directly connected to) the gates G of the transistors T3 and T4. Thus, the gates 306 of the transistors T1 and T2 are coupled to (e.g., directly connected to) one another, as is shown in FIG. 8A with a single first instance of the gate line 316 extending across the N-type elongated structure 304-1 and across the P-type elongated structure 304-2 (e.g., being electrically and/or physically continuous across multiple elongated structures 304) and forming, or being coupled to (e.g., directly connected to) the gate 306 of the transistor T2 provided along the N-type elongated structure 304-1 and the gate 306 of the transistor T1 provided along the P-type elongated structure 304-2. Similarly, the gates 306 of the transistors T3 and T4 are coupled to (e.g., directly connected to) one another, as is shown in FIG. 8A with a single second instance of the gate line 316 extending across the N-type elongated structure 304-1 and across the P-type elongated structure 304-2 (e.g., being electrically and/or physically continuous across multiple elongated structures 304) and forming, or being coupled to (e.g., directly connected to) the gate 306 of the transistor T4 provided along the N-type elongated structure 304-1 and the gate 306 of the transistor T3 provided along the P-type elongated structure 304-2. The gates 306 of the transistors T1-T4 are not specifically shown in FIG. 8A because they are obscured by the gate lines 316. As is shown in FIG. 8A, the elongated structures 304 of the IC device 800 may be angled elongated structures 304, with the angle 305 with respect to and/or with respect to the edges 303 of the support structure 302, and/or with respect to the gate lines 316, being defined as described with reference to FIG. 3. FIG. 8A further illustrates a via 332-6 and a via 332-7. The via 332-6 is coupled to (e.g., directly connected to) the gate line 316 extending between the transistors T1 and T2, in order to couple the gates 306 of the transistors T1 and T2 to the first input terminal A of the two-input NOR circuit 400D, while the via 332-7 is coupled to (e.g., directly connected to) the gate line 316 extending between the transistors T3 and T4, in order to couple the gates 306 of the transistors T3 and T4 to the second input terminal B of the two-input NOR circuit 400D.

The two-input NOR circuit 400D may further include an output terminal OUT coupled to (e.g., directly connected to) the second S/D terminals SD2 of each of the transistors T2 and T4 as well as to the first S/D terminal SD1 of the transistor T3. This is shown in FIG. 8A with the second S/D contact 324-2 of the transistors T2 and T4 being a single contact shared between these transistors and being coupled to (e.g., directly connected to) a first instance of the via 332-4 that connects the shared second S/D contact 324-2 of the transistors T2 and T4 to the output terminal OUT. This is further shown in FIG. 8A with the first S/D contact 324-1 of the transistor T3 being coupled to (e.g., directly connected to) a second instance of the via 332-4 that connects the first S/D contact 324-1 of the transistor T3 to the output terminal OUT.

In the two-input NOR circuit 400D, the second S/D terminals SD2 of the transistors T1 and T3 are coupled together. This is illustrated in FIG. 8A by showing the second S/D contact 324-2 of the transistors T1 and T3 as a single second S/D contact shared between these transistors.

The two-input NOR circuit 400D may further include a Vcc terminal coupled to (e.g., directly connected to) the first S/D terminal SD1 of the transistor T1. This is shown in FIG. 8A with the first S/D contact 324-1 of the transistor T1 being coupled to (e.g., directly connected to) the via 332-1, where the via 332-1 provides electrical coupling (e.g., direct electrical connection) to voltage Vcc. Similarly, the two-input NOR circuit 400D may further include a GND terminal coupled to (e.g., directly connected to) the first S/D terminals SD1 of the transistors T2 and T4. This is shown in FIG. 8A with the first S/D contact 324-1 of the transistors T2 and T4 being coupled to (e.g., directly connected to) the first and second instances of the vias 332-2, where the vias 332-2 provide electrical coupling (e.g., direct electrical connection) to the ground voltage.

As is shown in FIG. 8A, in some embodiments, all of the first S/D contacts 324-1 may be non-angled first S/D contacts 324-1 and all of the second S/D contacts 324-2 may be non-angled second S/D contacts 324-2, with the angle with respect to the elongated structures 304 and/or with respect to the edges 303 of the support structure 302 being defined as described for the first and second S/D contacts 324-1, 324-2 with reference to FIG. 3. In other embodiments of the IC device 800, any of the first or second S/D contacts 324-1, 324-2 may be angled.

The two-input NOR circuit 400D may be made particularly compact if the two NMOS transistors are provided along a single N-type elongated structure 304-1, as is shown in FIG. 8A with the transistors T2 and T4 provided along the N-type elongated structure 304-1, and if the two PMOS transistors are provided along a single P-type elongated structure 304-2, as is shown in FIG. 8A with the transistors T1 and T3 provided along the P-type elongated structure 304-2. As further shown in FIG. 8A, in some embodiments, isolation structures 336-1 and 336-2 may be provided to ensure electrical isolation of the two-input NOR circuit 400D from other transistors and other components that may be coupled to further portions of the elongated structures 304 (such other transistors and components not specifically shown in FIG. 8A). As is shown in FIG. 8A, in some embodiments, the isolation structures 336 may be non-angled isolation structures 336, with the angle with respect to the elongated structures 304 and/or with respect to the edges 303 of the support structure 302 substantially matching of the gates 306 as described above. In other embodiments of the IC device 800, any of the isolation structures 336 may be angled.

While FIG. 8A provides an illustration of a transistor layer of the IC device 800, FIG. 8B illustrates a metallization layer of the IC device 800. As is shown in FIG. 8B, an example metallization layer of the IC device 800 may include routing tracks 342-1, 342-2, 342-4, 342-6, and 342-7, where the routing track 342-1 may be coupled to (e.g., directly connected to) the via 332-1 for providing electrical connectivity to the voltage Vcc for the IC device 800, the routing track 342-2 may be coupled to (e.g., directly connected to) the two vias 332-2 for providing electrical connectivity to the ground voltage GND for the IC device 800, the routing track 342-4 may be coupled to (e.g., directly connected to) the two vias 332-4 for providing electrical connectivity to the output terminal OUT of the IC device 800, the routing track 342-6 may be coupled to (e.g., directly connected to) the via 332-6 for providing electrical connectivity to the first input terminal A of the IC device 800, and the routing track 342-7 may be coupled to (e.g., directly connected to) the via 332-7 for providing electrical connectivity to the second input terminal B of the IC device 800. FIG. 8B illustrates that the routing tracks 342 of the IC device 800 may be angled with respect to edges 303, e.g., be aligned with the angle 305 of the angled elongated structures 304. Even though FIGS. 8B illustrates all of the routing tracks 342-1, 342-2, 342-4, 342-6, and 342-7 being provided within a single metallization layer (e.g., a metal layer MO), in other embodiments of the IC device 800, any of the routing tracks 342-1, 342-2, 342-4, 342-6, and 342-7 may be provided in any of the metallization layers of the IC device 800.

Any of the angled transistors with angled routing tracks and any of the circuits with such transistors described herein (e.g., as described with reference to FIGS. 1-8) may be used to implement any suitable components. For example, in various embodiments, transistors described herein may be part of one or more of: a central processing unit, a memory device (e.g., a high-bandwidth memory device), a memory cell, a logic circuit, input/output circuitry, a field programmable gate array (FPGA) component such as an FPGA transceiver or an FPGA logic, a power delivery circuitry, an amplifier (e.g., a III-V amplifier), Peripheral Component Interconnect Express (PCIE) circuitry, Double Data Rate (DDR) transfer circuitry, a computing device (e.g., a wearable or a handheld computing device), etc.

The IC devices with angled transistors and angled routing tracks disclosed herein may be included in any suitable electronic device. FIGS. 9-13 illustrate various examples of apparatuses that may include one or more of the IC devices with angled transistors and angled routing tracks disclosed herein.

Figure 9:
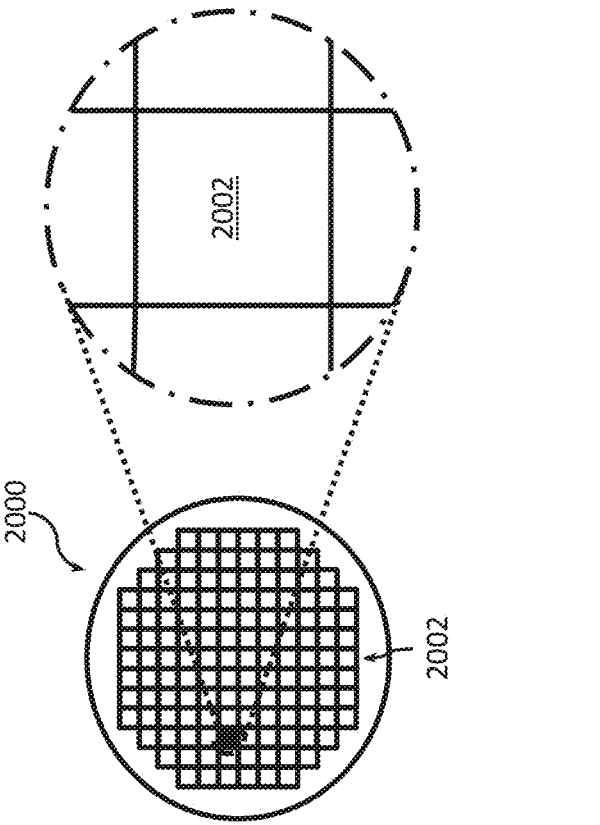
FIG. 9 provides top views of a wafer and dies that may include one or more IC devices with angled transistors and angled routing tracks in accordance with any of the embodiments disclosed herein.

FIG. 9 illustrates top views of a wafer 2000 and dies 2002 that may include one or more IC devices with angled transistors and angled routing tracks in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 10. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more IC devices with angled transistors and angled routing tracks as described herein). After the fabrication of the semiconductor product is complete (e.g., after manufacture of any embodiment of the IC devices with angled transistors and angled routing tracks as described herein), the wafer 2000 may undergo a singulation process in which each of the dies 2002 is separated from one another to provide discrete "chips" of the semiconductor product. In particular, devices that include one or more angled transistors and angled routing tracks as disclosed herein may take the form of the wafer 2000 (e.g., not singulated) or the form of the die 2002 (e.g., singulated). The die 2002 may include supporting circuitry to route electrical signals to various memory cells, transistors, capacitors, as well as any other IC components. In some embodiments, the wafer 2000 or the die 2002 may implement or include a memory device (e.g., a hysteretic memory device), a logic device (e.g., an AND, OR, NAND, or NOR gate), or any other suitable circuit element. Multiple ones of these devices may be combined on a single die 2002. For example, a memory array formed by multiple memory devices may be formed on a same die 2002 as a processing device (e.g., the processing device 2402 of FIG. 12) or other logic that is configured to store information in the memory devices or execute instructions stored in the memory array.

Figure 10:
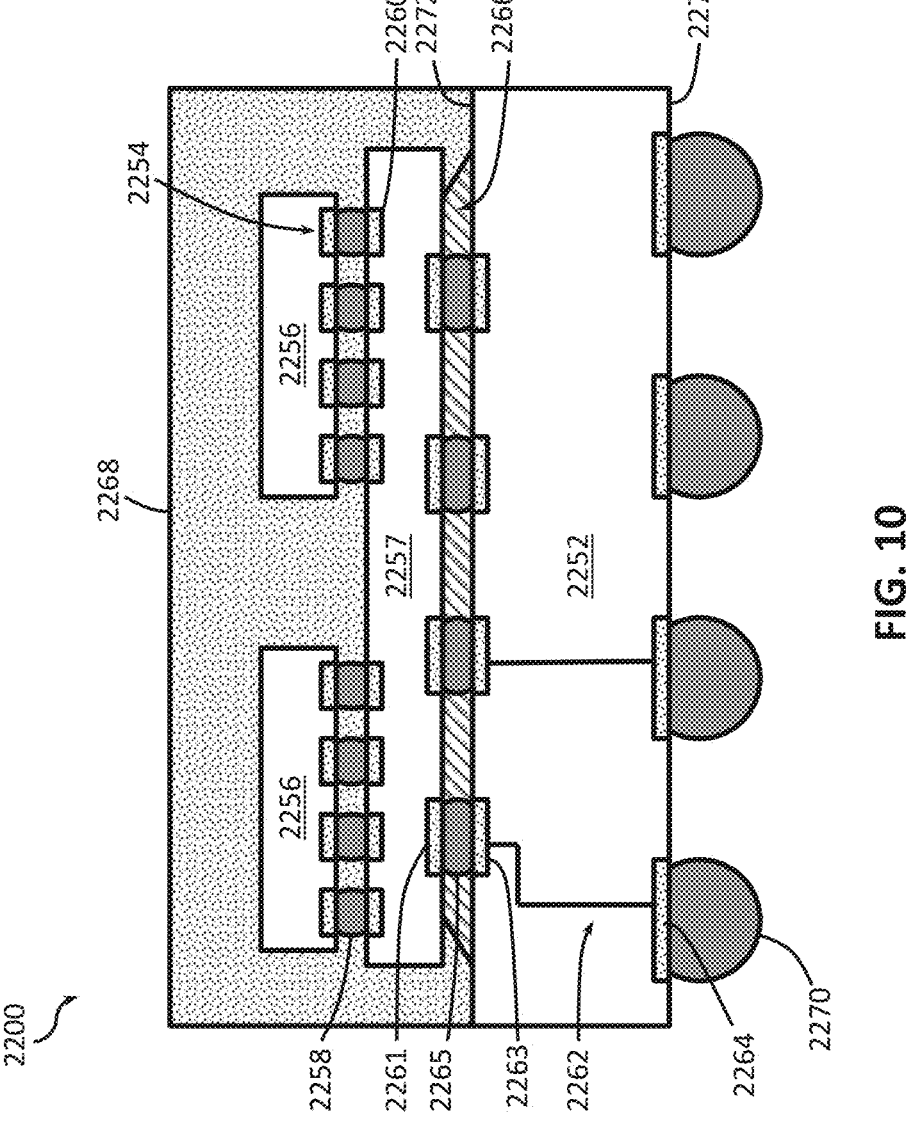
FIG. 10 is a cross-sectional side view of an IC package that may include one or more IC devices with angled transistors and angled routing tracks in accordance with any of the embodiments disclosed herein.

FIG. 10 is a side, cross-sectional view of an example IC package 2200 that may include one or more IC devices with angled transistors and angled routing tracks in accordance with any of the embodiments disclosed herein. In some embodiments, the IC package 2200 may be a system-in-package (SiP).

The package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 10 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 10 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 10 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 11.

The dies 2256 may take the form of any of the embodiments of the die 2002 discussed herein (e.g., may include any of the embodiments of the IC devices with angled transistors and angled routing tracks as described herein). In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be logic dies (e.g., silicon-based dies), and one or more of the dies 2256 may be memory dies (e.g., high-bandwidth memory), including embedded memory dies as described herein. In some embodiments, any of the dies 2256 may include one or more IC devices with angled transistors and angled routing tracks, e.g., as discussed above; in some embodiments, at least some of the dies 2256 may not include any IC devices with angled transistors and angled routing tracks.

The IC package 2200 illustrated in FIG. 10 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 10, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 11:
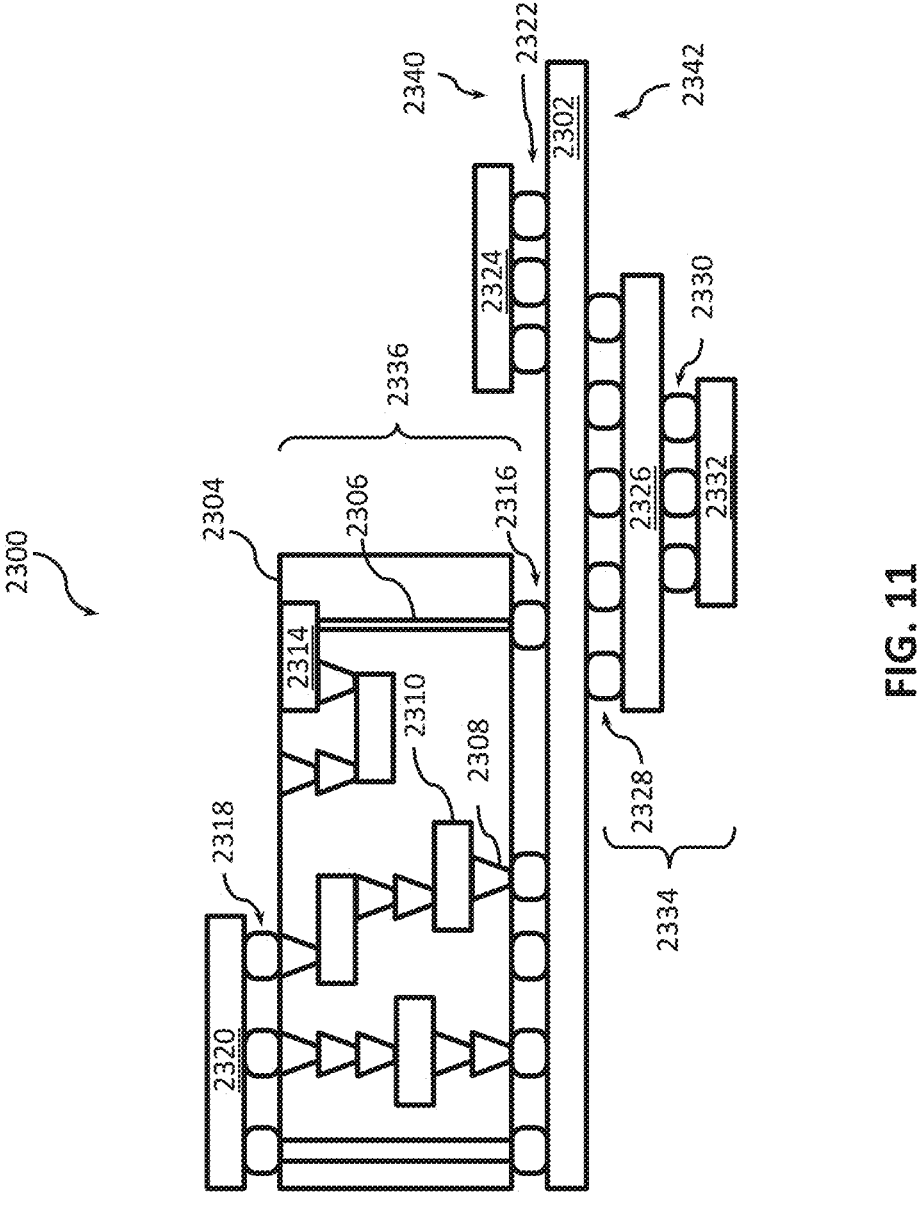
FIG. 11 is a cross-sectional side view of an IC device assembly that may include one or more IC devices with angled transistors and angled routing tracks in accordance with any of the embodiments disclosed herein.

FIG. 11 is a cross-sectional side view of an IC device assembly 2300 that may include components having one or more IC devices with angled transistors and angled routing tracks in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of one or more IC devices with angled transistors and angled routing tracks in accordance with any of the embodiments disclosed herein; e.g., any of the IC packages discussed below with reference to the IC device assembly 2300 may take the form of any of the embodiments of the IC package 2200 discussed above with reference to FIG. 10 (e.g., may include one or more IC devices with angled transistors and angled routing tracks provided on a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 11 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 11), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 9), an IC device, or any other suitable component. In particular, the IC package 2320 may include one or more IC devices with angled transistors and angled routing tracks as described herein. Although a single IC package 2320 is shown in FIG. 11, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 11, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as RF devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 11 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 12:
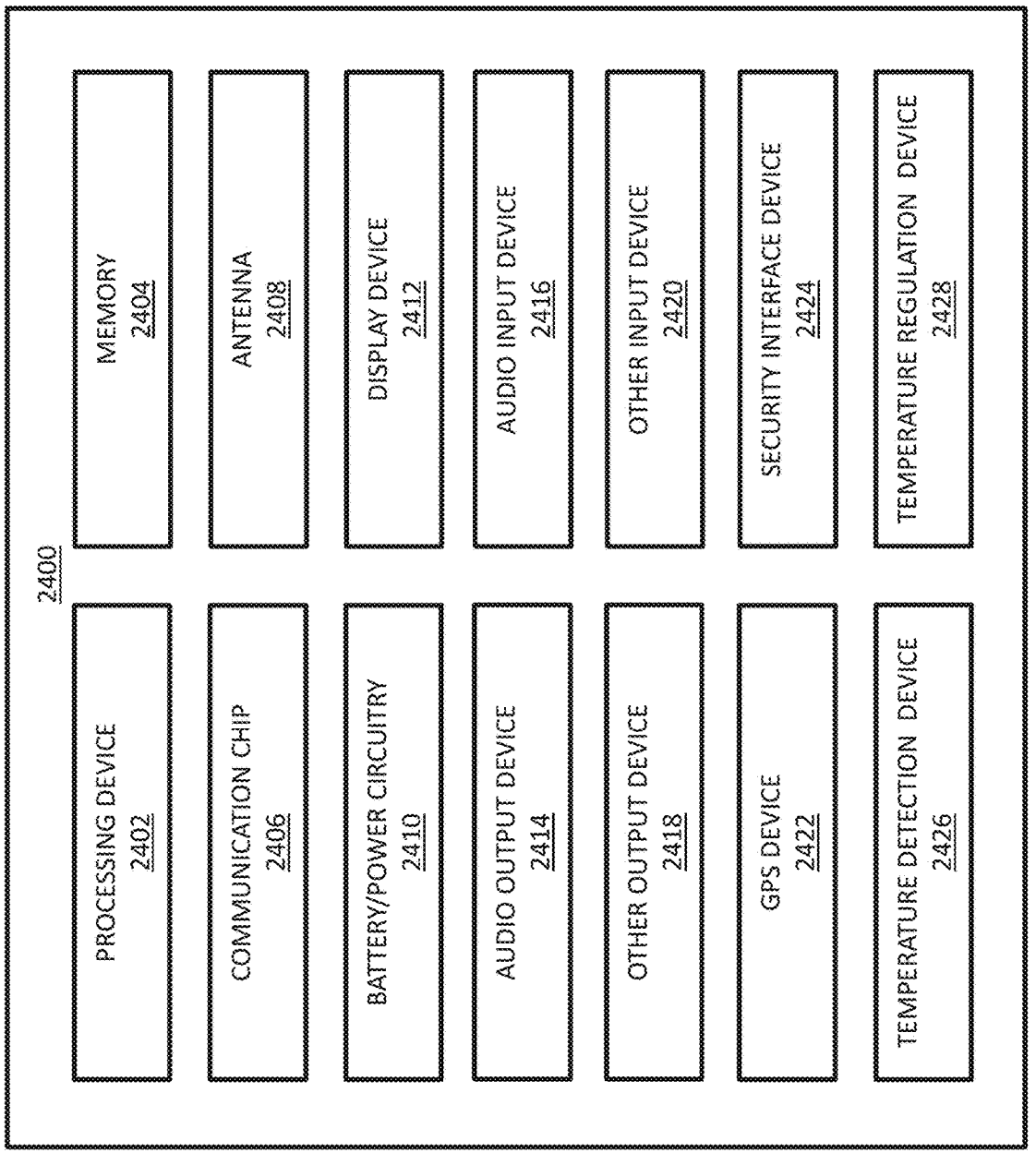
FIG. 12 is a block diagram of an example computing device that may include one or more IC devices with angled transistors and angled routing tracks in accordance with any of the embodiments disclosed herein.

FIG. 12 is a block diagram of an example computing device 2400 that may include one or more components including one or more IC devices with angled transistors and angled routing tracks in accordance with any of the embodiments disclosed herein. For example, any suitable ones of the components of the computing device 2400 may include a die (e.g., the die 2002 of FIG. 9) having one or more angled transistors with angled routing tracks as described herein. Any one or more of the components of the computing device 2400 may include, or be included in, an IC package 2200 of FIG. 10 or an IC device 2300 of FIG. 11.

A number of components are illustrated in FIG. 12 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single system-on-a-chip (SoC) die.

Additionally, in various embodiments, the computing device 2400 may not include one or more of the components illustrated in FIG. 12, but the computing device 2400 may include interface circuitry for coupling to the one or more components. For example, the computing device 2400 may not include a display device 2412, but may include display device interface circuitry (e.g., a connector and driver circuitry) to which a display device 2412 may be coupled. In another set of examples, the computing device 2400 may not include an audio input device 2416 or an audio output device 2414, but may include audio input or output device interface circuitry (e.g., connectors and supporting circuitry) to which an audio input device 2416 or audio output device 2414 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid state memory, and/or a hard drive. In some embodiments, the memory 2404 may include memory that shares a die with the processing device 2402. This memory may be used as cache memory and may include embedded DRAM (eDRAM) or spin transfer torque MRAM.

In some embodiments, the computing device 2400 may include a communication chip 2406 (e.g., one or more communication chips). For example, the communication chip 2406 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2406 may implement any of a number of wireless standards or protocols, including but not limited to Institute for Electrical and Electronic Engineers (IEEE) standards including Wi-Fi (IEEE 1402.11 family), IEEE 1402.16 standards (e.g., IEEE 1402.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 1402.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 1402.16 standards. The communication chip 2406 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2406 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2406 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2406 may operate in accordance with other wireless protocols in other embodiments. The computing device 2400 may include an antenna

2408 to facilitate wireless communications and/or to receive other wireless communications (such as AM or FM radio transmissions).

In some embodiments, the communication chip 2406 may manage wired communications, such as electrical, optical, or any other suitable communication protocols (e.g., the Ethernet). As noted above, the communication chip 2406 may include multiple communication chips. For instance, a first communication chip 2406 may be dedicated to shorter-range wireless communications such as Wi-Fi or Bluetooth, and a second communication chip 2406 may be dedicated to longer-range wireless communications such as global positioning system (GPS), EDGE, GPRS, CDMA, WiMAX, LTE, EV-DO, or others. In some embodiments, a first communication chip 2406 may be dedicated to wireless communications, and a second communication chip 2406 may be dedicated to wired communications.

The computing device 2400 may include a battery/power circuitry 2410. The battery/power circuitry 2410 may include one or more energy storage devices (e.g., batteries or capacitors) and/or circuitry for coupling components of the computing device 2400 to an energy source separate from the computing device 2400 (e.g., AC line power).

The computing device 2400 may include a display device 2412 (or corresponding interface circuitry, as discussed above). The display device 2412 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2414 (or corresponding interface circuitry, as discussed above). The audio output device 2414 may include any device that generates an audible indicator, such as speakers, headsets, or earbuds, for example.

The computing device 2400 may include an audio input device 2416 (or corresponding interface circuitry, as discussed above). The audio input device 2416 may include any device that generates a signal representative of a sound, such as microphones, microphone arrays, or digital instruments (e.g., instruments having a musical instrument digital interface (MIDI) output).

The computing device 2400 may include an other output device 2418 (or corresponding interface circuitry, as discussed above). Examples of the other output device 2418 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may include a GPS device 2422 (or corresponding interface circuitry, as discussed above). The GPS device 2422 may be in communication with a satellite-based system and may receive a location of the computing device 2400, as known in the art.

The computing device 2400 may include a security interface device 2424. The security interface device 2424 may include any device that provides security features for the computing device 2400 or for any individual components therein (e.g., for the processing device 2402 or for the memory 2404). Examples of security features may include authorization, access to digital certificates, access to items in keychains, etc. Examples of the security interface device 2424 may include a software firewall, a hardware firewall, an antivirus, a content filtering device, or an intrusion detection device.

In some embodiments, the computing device 2400 may include a temperature detection device 2426 and a temperature regulation device 2428.

The temperature detection device 2426 may include any device capable of determining temperatures of the computing device 2400 or of any individual components therein (e.g., temperatures of the processing device 2402 or of the memory 2404). In various embodiments, the temperature detection device 2426 may be configured to determine temperatures of an object (e.g., the computing device 2400, components of the computing device 2400, devices coupled to the computing device, etc.), temperatures of an environment (e.g., a data center that includes, is controlled by, or otherwise associated with the computing device 2400), and so on. The temperature detection device 2426 may include one or more temperature sensors. Different temperature sensors of the temperature detection device 2426 may have different locations within and around the computing device 2400. A temperature sensor may generate data (e.g., digital data) representing detected temperatures and provide the data to another device, e.g., to the temperature regulation device 2428, the processing device 2402, the memory 2404, etc. In some embodiments, a temperature sensor of the temperature detection device 2426 may be turned on or off, e.g., by the processing device 2402 or an external system. The temperature sensor detects temperatures when it is on and does not detect temperatures when it is off. In other embodiments, a temperature sensor of the temperature detection device 2426 may detect temperatures continuously and automatically or detect temperatures at predefined times or at times triggered by an event associated with the computing device 2400 or any components therein.

The temperature regulation device 2428 may include any device configured to change (e.g., decrease) temperatures, e.g., based on one or more target temperatures and/or based on temperature measurements performed by the temperature detection device 2426. A target temperature may be a preferred temperature. A target temperature may depend on a setting in which the computing device 2400 operates. In some embodiments, the target temperature may be 200 Kelvin degrees or lower. In some embodiments, the target temperature may be 20 Kelvin degrees or lower, or 5 Kelvin degrees or lower. Target temperatures for different objects and different environments of, or associated with, the computing device 2400 can be different. In some embodiments, cooling provided by the temperature regulation device 2428 may be a multi-stage process with temperatures ranging from room temperature to 4K or lower.

In some embodiments, the temperature regulation device 2428 may include one or more cooling devices. Different cooling device may have different locations within and around the computing device 2400. A cooling device of the temperature regulation device 2428 may be associated with one or more temperature sensors of the temperature detection device 2426 and may be configured to operate based on temperatures detected the temperature sensors. For instance, a cooling device may be configured to determine whether a detected ambient temperature is above the target temperature or whether the detected ambient temperature is higher than the target temperature by a predetermined value or determine whether any other temperature-related condition associated with the temperature of the computing device 2400 is satisfied. In response to determining that one or more temperature-related condition associated with the temperature of the computing device 2400 are satisfied (e.g., in response to determining that the detected ambient temperature is above the target temperature), a cooling device may trigger its cooling mechanism and start to decrease the ambient temperature. Otherwise, the cooling device does not trigger any cooling. A cooling device of the temperature regulation device 2428 may operate with various cooling mechanisms, such as evaporation cooling, radiation cooling, conduction cooling, convection cooling, other cooling mechanisms, or any combination thereof. A cooling device of the temperature regulation device 2428 may include a cooling agent, such as a water, oil, liquid nitrogen, liquid helium, etc. In some embodiments, the temperature regulation device 2428 may be, for example, a dilution refrigerator, a helium-3 refrigerator, or a liquid helium refrigerator. In some embodiments, the temperature regulation device 2428 or any portions thereof (e.g., one or more of the individual cooling devices) may be connected to the computing device 2400 in close proximity (e.g., less than about 1 meter) or may be provided in a separate enclosure where a dedicated heat exchanger (e.g., a compressor, a heating, ventilation, and air conditioning (HVAC) system, liquid helium, liquid nitrogen, etc.) may reside.

By maintaining the target temperatures, the energy consumption of the computing device 2400 (or components thereof) can be reduced, while the computing efficiency may be improved. For example, when the computing device 2400 (or components thereof) operates at lower temperatures, energy dissipation (e.g., heat dissipation) may be reduced. Further, energy consumed by semiconductor components (e.g., energy needed for switching transistors of any of the components of the computing device 2400) can also be reduced. Various semiconductor materials may have lower resistivity and/or higher mobility at lower temperatures. That way, the electrical current per unit supply voltage may be increased by lowering temperatures. Conversely, for the same current that would be needed, the supply voltage may be lowered by lowering temperatures. As energy corelates to the supply voltage, the energy consumption of the semiconductor components may lower too. In some implementations, the energy savings due to reducing heat dissipation and reducing energy consumed by semiconductor components of the computing device or components thereof may outweigh (sometimes significantly outweigh) the costs associated with energy needed for cooling.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

Figure 13:
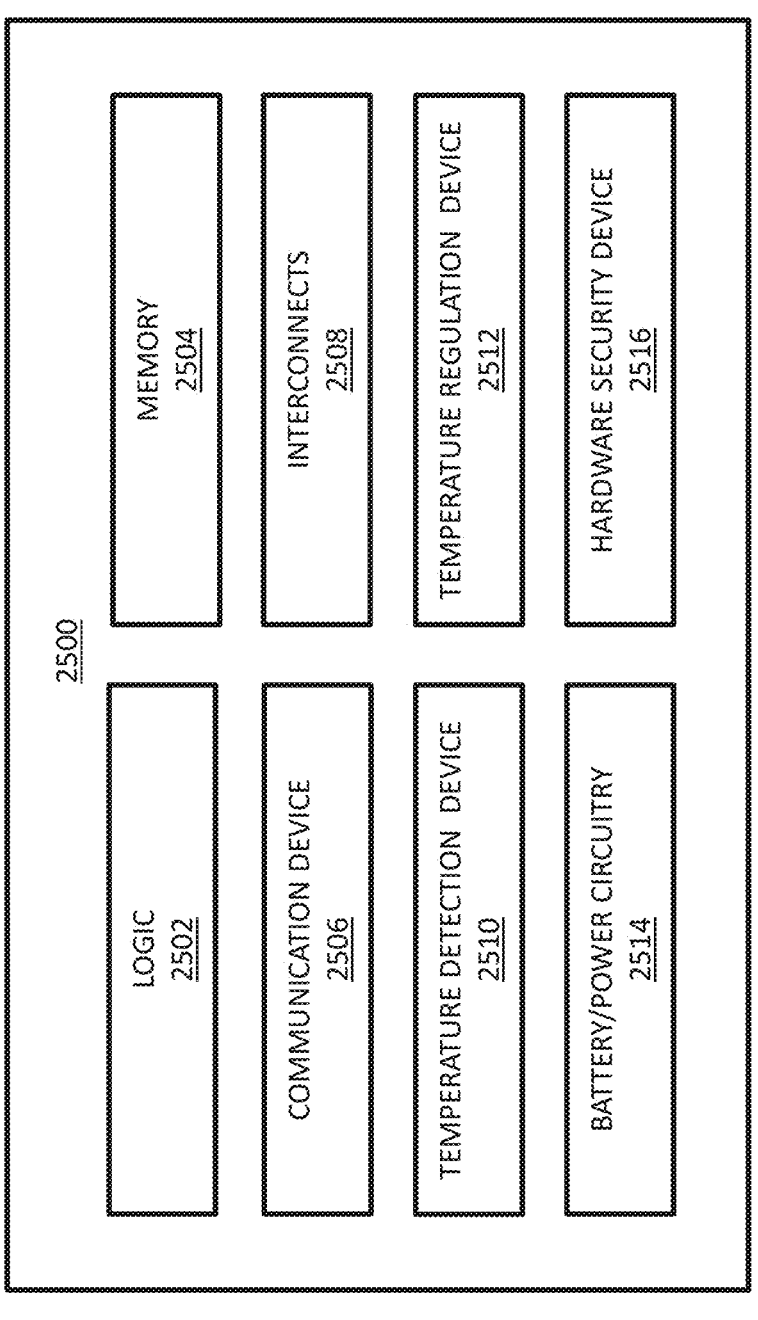
FIG. 13 is a block diagram of an example processing device that may include one or more IC devices with angled transistors and angled routing tracks in accordance with any of the embodiments disclosed herein.

FIG. 13 is a block diagram of an example processing device 2500 that may include one or more IC devices with angled transistors and angled routing tracks in accordance with any of the embodiments disclosed herein. For example, any suitable ones of the components of the processing device 2500 may include a die (e.g., the die 2002 of FIG. 9) having one or more angled transistors with angled routing tracks as described herein. Any one or more of the components of the processing device 2500 may include, or be included in, an IC device 2300 (FIG. 11). Any one or more of the components of the processing device 2500 may include, or be included in, an IC package 2200 of FIG. 10 or an IC device 2300 of FIG. 11. Any one or more of the components of the processing device 2500 may include, or be included in, a computing device 2400 of FIG. 12; for example, the processing device 2500 may be the processing device 2402 of the computing device 2400.

A number of components are illustrated in FIG. 13 as included in the processing device 2500, but any one or more of these components may be omitted or duplicated, as suitable for the application. In some embodiments, some or all of the components included in the processing device 2500 may be attached to one or more motherboards. In some embodiments, some or all of these components are fabricated on a single SoC die or coupled to a single support structure, e.g., to a single carrier substrate.

Additionally, in various embodiments, the processing device 2500 may not include one or more of the components illustrated in FIG. 13, but the processing device 2500 may include interface circuitry for coupling to the one or more components. For example, the processing device 2500 may not include a memory 2504, but may include display device interface circuitry (e.g., a connector and driver circuitry) to which a memory 2504 may be coupled.

The processing device 2500 may include logic circuitry 2502 (e.g., one or more circuits configured to implement logic/compute functionality). Examples of such circuits include ICs implementing one or more of input/output (I/O) functions, arithmetic operations, pipelining of data, etc.

In some embodiments, the logic circuitry 2502 may include one or more circuits responsible for read/write operations with respect to the data stored in the memory 2504. To that end, the logic circuitry 2502 may include one or more I/O ICs configured to control access to data stored in the memory 2504.

In some embodiments, the logic circuitry 2502 may include one or more high-performance compute dies, configured to perform various operations with respect to data stored in the memory 2504 (e.g., arithmetic and logic operations, pipelining of data from one or more memory dies of the memory 2504, and possibly also data from external devices/chips). In some embodiments, the logic circuitry 2502 may be configured to only control I/O access to data but not perform any operations on the data. In some embodiments, the logic circuitry 2502 may implement ICs configured to implement I/O control of data stored in the memory 2504, assemble data from the memory 2504 for transport (e.g., transport over a central bus) to devices/chips that are either internal or external to the processing device 2500, etc. In some embodiments, the logic circuitry 2502 may not be configured to perform any operations on the data besides I/O and assembling for transport to the memory 2504.

The processing device 2500 may include a memory 2504, which may include one or more ICs configure to implement memory circuitry (e.g., ICs implementing one or more of memory devices, memory arrays, control logic configured to control the memory devices and arrays, etc.). In some embodiments, the memory 2504 may be implemented substantially as described above with reference to the memory 2404 (FIG. 12). In some embodiments, the memory 2504 may be a designated device configured to provide storage functionality for the components of the processing device 2500 (e.g., local), while the memory 1604 may be configured to provide system-level storage functionality for the entire computing device 2400 (e.g., global). In some embodiments, the memory 2504 may include memory that shares a die with the logic circuitry 2502.

In some embodiments, the memory 2504 may include a flat memory (also sometimes referred to as a "flat hierarchy memory" or a "linear memory") and, therefore, may also be referred to as a "basin memory." As known in the art, a flat memory or a linear memory refers to a memory addressing paradigm in which memory may appear to the program as a single contiguous address space, where a processor can directly and linearly address all of the available memory locations without having to resort to memory segmentation or paging schemes. Thus, the memory implemented in the memory 2504 may be a memory that is not divided into hierarchical layer or levels in terms of access of its data.

In some embodiments, the memory 2504 may include a hierarchical memory. In this context, hierarchical memory refers to the concept of computer architecture where computer storage is separated into a hierarchy based on features of memory such as response time, complexity, capacity, performance, and controlling technology. Designing for high performance may require considering the restrictions of the memory hierarchy, e.g., the size and capabilities of each component. With hierarchical memory, each of the various memory components can be viewed as part of a hierarchy of memories ($m_1$, $m_2$, . . . $m_n$) in which each member $m_i$ is typically smaller and faster than the next highest member $m_{i+1}$ of the hierarchy. To limit waiting by higher levels, a lower level of a hierarchical memory structure may respond by filling a buffer and then signaling for activating the transfer. For example, in some embodiments, the hierarchical memory implemented in the memory 2504 may be separated into four major storage levels: 1) internal storage (e.g., processor registers and cache), 2) main memory (e.g., the system RAM and controller cards), and 3) on-line mass storage (e.g., secondary storage), and 4) off-line bulk storage (e.g., tertiary, and off-line storage). However, as the number of levels in the memory hierarchy and the performance at each level has increased over time and is likely to continue to increase in the future, this example hierarchical division provides only one non-limiting example of how the memory 2504 may be arranged.

The processing device 2500 may include a communication device 2506, which may be implemented substantially as described above with reference to the communication chip 2406 (FIG. 12). In some embodiments, the communication device 2506 may be a designated device configured to provide communication functionality for the components of the processing device 2500 (e.g., local), while the communication chip 2406 may be configured to provide system-level communication functionality for the entire computing device 2400 (e.g., global).

The processing device 2500 may include interconnects 2508, which may include any element or device that includes an electrically conductive material for providing electrical connectivity to one or more components of, or associated with, a processing device 2500 or/and between various such components. Examples of the interconnects 2508 include conductive lines/wires (also sometimes referred to as "lines" or "metal lines" or "trenches") and conductive vias (also sometimes referred to as "vias" or "metal vias"), metallization stacks, redistribution layers, metal-insulator-metal (MIM) structures, etc.

The processing device 2500 may include a temperature detection device 2510 which may be implemented substantially as described above with reference to the temperature detection device 2426 of FIG. 12 but configured to determine temperatures on a more local scale, e.g., of the processing device 2500 of components thereof. In some embodiments, the temperature detection device 2510 may be a designated device configured to provide temperature detection functionality for the components of the processing device 2500 (e.g., local), while the temperature detection device 2426 may be configured to provide system-level temperature detection functionality for the entire computing device 2400 (e.g., global).

The processing device 2500 may include a temperature regulation device 2512 which may be implemented substantially as described above with reference to the temperature regulation device 2428 of FIG. 12 but configured to regulate temperatures on a more local scale, e.g., of the processing device 2500 of components thereof. In some embodiments, the temperature regulation device 2512 may be a designated device configured to provide temperature regulation functionality for the components of the processing device 2500 (e.g., local), while the temperature regulation device 2428 may be configured to provide system-level temperature regulation functionality for the entire computing device 2400 (e.g., global).

The processing device 2500 may include a battery/power circuitry 2514 which may be implemented substantially as described above with reference to the battery/power circuitry 2410 of FIG. 12. In some embodiments, the battery/power circuitry 2514 may be a designated device configured to provide battery/power functionality for the components of the processing device 2500 (e.g., local), while the battery/power circuitry 2410 may be configured to provide system-level battery/power functionality for the entire computing device 2400 (e.g., global).

The processing device 2500 may include a hardware security device 2516 which may be implemented substantially as described above with reference to the security interface device 2424 of FIG. 12. In some embodiments, the hardware security device 2516 may be a physical computing device configured to safeguard and manage digital keys, perform encryption and decryption functions for digital signatures, authentication, and other cryptographic functions. In some embodiments, the hardware security device 2516 may include one or more secure cryptoprocessors chips.

The above description of illustrated implementations of the disclosure, including what is described in the Abstract, is not intended to be exhaustive or to limit the disclosure to the precise forms disclosed. Unless specified otherwise, in various embodiments, features described with respect to one of the drawings may be combined with those described with respect to other drawings.

The following paragraphs provide various examples of the embodiments disclosed herein.

Example 1 provides an IC device that includes a support structure (e.g., a die, a substrate, a carrier substrate, etc.); a first elongated structure (e.g., a first fin or nanoribbon) and a second elongated structure (e.g., a second fin or nanoribbon) over the support structure; a logic circuit provided over the support structure, the logic circuit including a plurality of transistors, where an individual transistor includes a gate over or at least partially wrapping around a channel region, the plurality of transistors includes a first transistor and a second transistor, the channel region of the first transistor includes a semiconductor material of a portion of the first elongated structure, and the channel region of the second transistor includes a semiconductor material of a portion of the second elongated structure; a gate line having a first portion that forms, or is in electrically conductive contact with, the gate of the first transistor and having a second portion that forms, or is in electrically conductive contact with, the gate of the second transistor; and a routing track in a metallization layer provided over the support structure, the routing track coupled (e.g., electrically connected) to one or more terminals of the plurality of transistors. In such an IC device, an angle between an edge (e.g., one of edges) of the support structure and each of a projection of the first elongated structure and a projection of the second elongated structure onto a plane of the support structure is between about 10 degrees and 80 degrees (e.g., the first and second elongated structures are angled with respect to one edge of the support structure); an angle between the edge of the support structure and a projection of the routing track onto the plane of the support structure is substantially equal to the angle between the edge of the support structure and the projection of the first elongated structure onto the plane of the support structure (e.g., the routing track is angled with respect to one edge of the support structure); and an angle between the edge of the support structure and a projection of the gate line onto the plane of the support structure is substantially equal to either 0 or 90 degrees (e.g., the gate line is non-angled with respect to one edge of the support structure).

Example 2 provides the IC device according to example 1, where the individual transistor further includes a first region and a second region, where one of the first region and the second region is a source region and another one of the first region and the second region is a drain region (e.g., the first region is a first S/D region and the second region is a second S/D region), and the one or more terminals of the plurality of transistors to which the routing track is coupled include the first region of the first transistor.

Example 3 provides the IC device according to example 2, where the plurality of transistors further includes a third transistor and a fourth transistor, the channel region of the third transistor includes a semiconductor material of a further portion of the first elongated structure, the channel region of the fourth transistor includes a semiconductor material of a further portion of the second elongated structure, and the one or more terminals of the plurality of transistors to which the routing track is coupled further include the first region of the third transistor.

Example 4 provides the IC device according to example 3, where the routing track is a first routing track, the IC device further includes a second routing track in the metallization layer provided over the support structure, the second routing track coupled (e.g., electrically connected) to one or more further terminals of the plurality of transistors, the one or more further terminals of the plurality of transistors to which the second routing track is coupled include the first region of the second transistor, and a projection of the second routing track onto the plane of the support structure is substantially parallel to the projection of the first routing track onto the plane of the support structure.

Example 5 provides the IC device according to example 4, where the one or more further terminals of the plurality of transistors to which the second routing track is coupled further include the first region of the fourth transistor.

Example 6 provides the IC device according to any one of examples 4-5, further including a contact line having a first portion that forms, or is in electrically conductive contact with, the second region of the first transistor and having a second portion that forms, or is in electrically conductive contact with, the second region of the second transistor (e.g., the contact line is a S/D contact line). In such an IC device, a projection of the contact line onto the plane of the support structure is substantially parallel to the projection of the gate line onto the plane of the support structure (e.g., similar to the gate line, the S/D contact line is non-angled with respect to one edge of the support structure).

Example 7 provides the IC device according to example 6, further including a third routing track in the metallization layer provided over the support structure, the third routing track coupled (e.g., electrically connected) to the contact line. In such an IC device a projection of the third routing track onto the plane of the support structure is substantially parallel to the projection of the first routing track onto the plane of the support structure.

Example 8 provides the IC device according to any one of examples 1-7, where the routing track is one of a plurality of routing tracks in the metallization layer provided over the support structure, different ones of the plurality of routing tracks are coupled (e.g., electrically connected) to different sets of one or more terminals of the plurality of transistors, and projections of the routing tracks onto the plane of the support structure are substantially parallel.

Example 9 provides the IC device according to any one of examples 1-8, where each of the first elongated structure and the second elongated structure is a fin or a nanoribbon, the semiconductor material of the portion of the first elongated structure that is in the channel region of the first transistor is a P-type semiconductor material, and the semiconductor material of the portion of the second elongated structure that is in the channel region of the second transistor is an N-type semiconductor material.

Example 10 provides the IC device according to any one of examples 1-9, where the logic circuit is one of a two-legged inverter circuit, a buffer circuit, a two-input NAND circuit, and a two-input NOR circuit.

Example 11 provides an IC device that includes a support structure; a plurality of fins or nanoribbons provided over the support structure; a plurality of transistors provided having channel regions in different ones of the plurality of fins or nanoribbons; and a plurality of routing tracks in a metallization layer provided over the support structure, different ones of the routing tracks coupled (e.g., electrically connected) to different sets of one or more terminals of the plurality of transistors, where the plurality of fins or nanoribbons and the plurality of routing tracks extend along a first direction, an edge (e.g., one of edges) of the support structure extends along a second direction, and an angle between the first and second directions is less than 90 degrees.

Example 12 provides the IC device according to example 11, where the angle is between about 10 and 80 degrees.

Example 13 provides the IC device according to any one of examples 11-12, further including a gate line coupled to the channel region of two or more of the plurality of transistors, the gate line extending along a third direction, and an angle between the second and third directions is either 0 degrees or 90 degrees.

Example 14 provides the IC device according to example 13, further including a contact line coupled to a source region or a drain region of two or more of the plurality of transistors, the contact line extending along a fourth direction, and an angle between the second and fourth directions is either 0 degrees or 90 degrees.

Example 15 provides the IC device according to any one of examples 11-14, where the IC device includes a logic circuit, the logic circuit includes two or more transistors of the plurality of transistors, and the plurality of routing tracks includes a first routing track coupled to an input terminal of the logic circuit, a second routing track coupled to an output terminal of the logic circuit, and a third routing track coupled to a reference potential terminal of the logic circuit.

Example 16 provides the IC device according to example 15, where the plurality of routing tracks further includes a fourth routing track coupled to a further input terminal of the logic circuit, and fifth routing track coupled to a ground terminal of the logic circuit.

Example 17 provides the IC device according to any one of examples 15-16, where one of the two or more transistors of the logic circuit is a P-type transistor, and another one of the two or more transistors of the logic circuit is an N-type transistor.

Example 18 provides the IC device according to any one of examples 11-17, where the logic circuit is one of a two-legged inverter circuit, a buffer circuit, a two-input NAND circuit, and a two-input NOR circuit.

Example 19 provides an IC device that includes a support structure; a plurality of fins or nanoribbons provided over the support structure; a plurality of transistors provided having channel regions in different ones of the plurality of fins or nanoribbons; a gate line coupled to the channel region of two or more of the plurality of transistors; and a plurality of routing tracks in a metallization layer provided over the support structure, different ones of the routing tracks coupled (e.g., electrically connected) to different sets of one or more terminals of the plurality of transistors, where the gate line extends along a first direction, the routing tracks extend along a second direction, and an angle between the first and second directions is less than 90 degrees.

Example 20 provides the IC device according to example 19, where the angle is between about 10 and 80 degrees.

Example 21 provides the IC device according to any one of the preceding examples, where the IC device includes or is a part of a central processing unit.

Example 22 provides the IC device according to any one of the preceding examples, where the IC device includes or is a part of a memory device, e.g., a high-bandwidth memory device.

Example 23 provides the IC device according to any one of the preceding examples, where the IC device further includes a plurality of memory cells, each of the memory cells including a storage element.

Example 24 provides the IC device according to example 23, where the storage element is one of a capacitor, a magnetoresistive material, a ferroelectric material, or a resistance-changing material.

Example 25 provides the IC device according to any one of the preceding examples, where the IC device includes or is a part of a logic circuit.

Example 26 provides the IC device according to any one of the preceding examples, where the IC device includes or is a part of input/output circuitry.

Example 27 provides the IC device according to any one of the preceding examples, where the IC device includes or is a part of an FPGA transceiver.

Example 28 provides the IC device according to any one of the preceding examples, where the IC device includes or is a part of an FPGA logic.

Example 29 provides the IC device according to any one of the preceding examples, where the IC device includes or is a part of a power delivery circuitry.

Example 30 provides the IC device according to any one of the preceding examples, where the IC device includes or is a part of a III-V amplifier.

Example 31 provides the IC device according to any one of the preceding examples, where the IC device includes or is a part of PCIE circuitry or DDR transfer circuitry.

Example 32 provides an IC package that includes a die comprising an IC device according to any one of the preceding examples; and a further IC component, coupled to the die.

Example 33 provides the IC package according to example 32, where the further IC component includes one of a package substrate, an interposer, or a further IC support structure.

Example 34 provides a computing device that includes a carrier substrate and an IC device, coupled to the carrier substrate, where the IC device is an IC device according to any one of the preceding examples, or the IC device is included in the IC package according to any one of examples 32-33.

Example 35 provides the computing device according to example 34, where the computing device is a wearable or handheld computing device.

Example 36 provides the computing device according to examples 34 or 35, where the computing device further includes one or more communication chips and an antenna.

Example 37 provides the computing device according to any one of examples 34-36, where the carrier substrate is a motherboard.

Example 38 provides a method of manufacturing an IC device, the method including providing the IC device according to any one of the preceding examples.

The invention claimed is:

1. An integrated circuit (IC) device, comprising:

a die;

a first elongated structure and a second elongated structure over the die;

a logic circuit over the die, the logic circuit comprising a plurality of transistors, wherein an individual transistor of the plurality of transistors includes a gate over or at least partially wrapping around a channel region, a first region, and a second region, wherein one of the first region and the second region is a source region and another one of the first region and the second region is a drain region, wherein the plurality of transistors includes a first transistor, a second transistor, a third transistor, and a fourth transistor, the channel region of the first transistor includes a semiconductor material of a first portion of the first elongated structure, the channel region of the third transistor includes a semiconductor material of a second portion of the first elongated structure, the channel region of the second transistor includes a semiconductor material of a first portion of the second elongated structure, and the channel region of the fourth transistor includes a semiconductor material of a second portion of the second elongated structure;

a first conductive line having a first portion that is, or is in electrically conductive contact with, the gate of the first transistor and having a second portion that is, or is in electrically conductive contact with, the gate of the second transistor;

a second conductive line having a first portion that is, or is in electrically conductive contact with, the gate of the third transistor and having a second portion that is, or is in electrically conductive contact with, the gate of the fourth transistor; and a third conductive line conductively coupled to the second region of the first transistor, the second region of the second transistor, the second region of the third transistor, and the second region of the fourth transistor, wherein:

an angle between an edge of the die and each of a projection of the first elongated structure and a projection of the second elongated structure onto a plane of the die is between about 10 degrees and 80 degrees, and an angle between the edge of the die and a projection of each of the first conductive line, the second conductive line, and the third conductive line onto the plane of the die is substantially equal to either 0 or 90 degrees.

2. The IC device according to claim 1, further comprising:

a first routing track conductively coupled to the first region of the first transistor and the first region of the third transistor; and a second routing track conductively coupled to the first region of the second transistor and the first region of the fourth transistor, wherein an angle between the edge of the die and a projection of the first routing track onto the plane of the die is between about 10 degrees and 80 degrees.

3. The IC device according to claim 1, wherein the logic circuit is one of a two- legged inverter circuit.

4. The IC device according to claim 1, wherein the first transistor and the third transistor are P-type transistors, and wherein the second transistor and the fourth transistor are N-type transistors.

5. The IC device according to claim 2, wherein the projection of the first routing track onto the plane of the die is substantially parallel to the projection of the first elongated structure.

6. The IC device according to claim 5, wherein a projection of the second routing track onto the plane of the die is substantially parallel to the projection of the first routing track.

7. The IC device according to claim 2, wherein an angle between the edge of the die and a projection of the second routing track onto the plane of the die is between about 10 degrees and 80 degrees.

8. The IC device according to claim 7, wherein the projection of the second routing track onto the plane of the die is substantially parallel to the projection of the first elongated structure.

9. The IC device according to claim 2, further comprising:

a third routing track conductively coupled to the gate of the first transistor, the gate of the second transistor, and an input to the logic circuit, wherein an angle between the edge of the die and a projection of the third routing track onto the plane of the die is between about 10 degrees and 80 degrees.

10. The IC device according to claim 2, further comprising:

a fourth routing track conductively coupled to the gate of the third transistor, the gate of the fourth transistor, and an output of the logic circuit, wherein an angle between the edge of the die and a projection of the fourth routing track onto the plane of the die is between about 10 degrees and 80 degrees.

11. An integrated circuit (IC) device, comprising:

a substrate;

a plurality of fins or nanoribbons over the substrate;

a plurality of transistors having channel regions in different ones of the plurality of fins or nanoribbons;

a logic circuit, wherein the logic circuit includes two or more transistors of the plurality of transistors, and wherein the logic circuit is one of a two-legged inverter circuit, a buffer circuit, and a two-input NOR circuit; and a plurality of routing tracks in a metallization layer over the substrate, selectively coupled to various terminals of the plurality of transistors, wherein the plurality of fins or nanoribbons and the plurality of routing tracks extend along a first direction, an edge of the substrate extends along a second direction, and an angle between the first and second directions is greater than zero and less than 90 degrees.

12. The IC device according to claim 11, wherein the angle is between about 10 and 80 degrees.

13. The IC device according to claim 11, further comprising a gate line coupled to the channel region of two or more of the plurality of transistors, the gate line extending along a third direction, and an angle between the second direction and the third direction is either 0 degrees or 90 degrees.

14. The IC device according to claim 13, further comprising a contact line coupled to a source region or a drain region of two or more of the plurality of transistors, the contact line extending along a fourth direction, and an angle between the second direction and the fourth direction is either 0 degrees or 90 degrees.

15. The IC device according to claim 11, wherein:

the plurality of routing tracks includes a first routing track coupled to an input terminal of the logic circuit, a second routing track coupled to an output terminal of the logic circuit, and a third routing track coupled to a reference potential terminal of the logic circuit.

16. The IC device according to claim 15, wherein the plurality of routing tracks further includes a fourth routing track coupled to a further input terminal of the logic circuit, and fifth routing track coupled to a ground terminal of the logic circuit.

17. The IC device according to claim 15, wherein one of the two or more transistors of the logic circuit is a P-type transistor, and another one of the two or more transistors of the logic circuit is an N-type transistor.

18. An integrated circuit (IC) device, comprising:

a die;

a first elongated structure and a second elongated structure over the die;

a logic circuit over the die, the logic circuit comprising a plurality of transistors, wherein an individual transistor of the plurality of transistors includes a gate over or at least partially wrapping around a channel region, a first region, and a second region, wherein one of the first region and the second region is a source region and another one of the first region and the second region is a drain region, wherein the plurality of transistors includes a first transistor, a second transistor, a third transistor, and a fourth transistor, the channel region of the first transistor includes a semiconductor material of a first portion of the first elongated structure, the channel region of the third transistor includes a semiconductor material of a second portion of the first elongated structure, the channel region of the second transistor includes a semiconductor material of a first portion of the second elongated structure, and the channel region of the fourth transistor includes a semiconductor material of a second portion of the second elongated structure;

a first conductive line having a first portion that is, or is in electrically conductive contact with, the gate of the first transistor and having a second portion that is, or is in electrically conductive contact with, the gate of the second transistor, wherein the first conductive line is conductively coupled to a first input of the logic circuit;

a second conductive line having a first portion that is, or is in electrically conductive contact with, the gate of the third transistor and having a second portion that is, or is in electrically conductive contact with, the gate of the fourth transistor, wherein the second conductive line is conductively coupled to a second input of the logic circuit; and a third conductive line conductively coupled to the second region of the first transistor, the second region of the third transistor, the first region of the fourth transistor, and an output of the logic circuit;

wherein:

an angle between an edge of the die and each of a projection of the first elongated structure and a projection of the second elongated structure onto a plane of the die is between about 10 degrees and 80 degrees, and an angle between the edge of the die and a projection of each of the first conductive line, the second conductive line, and the third conductive line onto the plane of the die is between about 10 degrees and 80 degrees.

19. The IC device according to claim 18, further comprising:

a first routing track conductively coupled to the first region of the first transistor and the first region of the third transistor; and a second routing track conductively coupled to the first region of the second transistor, wherein an angle between the edge of the die and a projection of each of the first routing track and the second routing track onto the plane of the die is between about 10 degrees and 80 degrees.

20. The IC device according to claim 18, wherein the first transistor and the third transistor are P-type transistors, and wherein the second transistor and the fourth transistor are N-type transistors.

* * * * *